United States Patent
Nishimura et al.

(10) Patent No.: US 11,487,055 B2
(45) Date of Patent: Nov. 1, 2022

(54) LAMINATE

(71) Applicant: FUJIFILM Corporation, Tokyo (JP)

(72) Inventors: Naoya Nishimura, Kanagawa (JP); Fumitake Mitobe, Kanagawa (JP); Yuzo Fujiki, Kanagawa (JP); Jun Takeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 170 days.

(21) Appl. No.: 16/940,798

(22) Filed: Jul. 28, 2020

(65) Prior Publication Data

US 2020/0355847 A1 Nov. 12, 2020

Related U.S. Application Data

(63) Continuation of application No. PCT/JP2019/003135, filed on Jan. 30, 2019.

(30) Foreign Application Priority Data

Jan. 30, 2018 (JP) .............................. JP2018-013543

(51) Int. Cl.
  *G02B 5/30* (2006.01)
  *G02B 1/14* (2015.01)
  (Continued)

(52) U.S. Cl.
  CPC .............. *G02B 5/3083* (2013.01); *G02B 1/04* (2013.01); *G02B 1/14* (2015.01); *G02F 1/13363* (2013.01);
  (Continued)

(58) Field of Classification Search
  CPC .......... G02B 1/04; G02B 1/14; G02B 5/3083; H01L 27/323; H01L 27/3232;
  (Continued)

(56) References Cited

U.S. PATENT DOCUMENTS

2001/0033135 A1* 10/2001 Duggal ............... H01L 27/3211
                                                              313/506
2013/0070899 A1    3/2013 Morishima et al.
(Continued)

FOREIGN PATENT DOCUMENTS

CN       102822704 A       12/2012
CN       105283783 A        1/2016
(Continued)

OTHER PUBLICATIONS

Office Action, issued by the State Intellectual Property Office dated Sep. 17, 2021, in connection with Chinese Patent Application No. 201980010882.0.

(Continued)

*Primary Examiner* — Sophie Hon
(74) *Attorney, Agent, or Firm* — Edwards Neils LLC; Jean C. Edwards, Esq.

(57) ABSTRACT

An object of the present invention is to provide a laminate in which the coloring of reflected light is reduced. The laminate includes an optical film having a light absorption anisotropic film formed using a composition including a dichroic substance and having a transmittance of more than 50%, a λ/4 plate, and a metal electrode in this order, in which in a case where a degree (%) of polarization at a wavelength of λ of the optical film is defined as P(λ) and a reflectance (%) at the wavelength of λ of the metal electrode is defined as R(λ), a ratio of a minimum value of R/P to a maximum value of R/P at wavelengths of 450 nm, 550 nm, and 650 nm is more than 85%.

20 Claims, 2 Drawing Sheets

(51) Int. Cl.
   *G02B 1/04*      (2006.01)
   *H01L 27/32*     (2006.01)
   *H01L 51/52*     (2006.01)
   *G02F 1/13363*   (2006.01)

(52) U.S. Cl.
   CPC ........ *H01L 27/323* (2013.01); *H01L 27/3232* (2013.01); *H01L 51/5293* (2013.01); *C09K 2323/031* (2020.08)

(58) Field of Classification Search
   CPC ............ H01L 51/5293; H01L 51/5281; C09K 2323/031; G02F 1/13363
   See application file for complete search history.

(56) References Cited

U.S. PATENT DOCUMENTS

| | | |
|---|---|---|
| 2015/0062505 A1 | 3/2015 | Hatanaka et al. |
| 2016/0062020 A1 | 3/2016 | Kogure et al. |
| 2016/0085101 A1 | 3/2016 | Saitoh et al. |
| 2016/0154275 A1 | 6/2016 | Saneto et al. |
| 2018/0004017 A1* | 1/2018 | Hatsumi ............... G02F 1/0045 |
| 2018/0011234 A1 | 1/2018 | Takahashi |
| 2019/0071571 A1 | 3/2019 | Takada et al. |

FOREIGN PATENT DOCUMENTS

| | | | | |
|---|---|---|---|---|
| CN | 105452945 A | | 3/2016 | |
| CN | 111670391 B | * | 3/2022 | ............ B32B 7/023 |
| JP | 2006-317747 A | | 11/2006 | |
| JP | 2012-027322 A | | 2/2012 | |
| JP | 2013-191276 A | | 9/2013 | |
| JP | 2015-163934 A | | 9/2015 | |
| JP | 6910481 B2 | * | 7/2021 | ............ B32B 7/023 |
| WO | 2017/195833 A1 | | 11/2017 | |

OTHER PUBLICATIONS

International Search Report issued in PCT/JP2019/003135 dated May 7, 2019.
Written Opinion issued in PCT/JP2019/003135 dated May 7, 2019.
International Preliminary Report on Patentability completed by WIPO on Aug. 4, 2020 in connection with International Patent Application No. PCT/JP2019/003135.

* cited by examiner

LAMINATE

CROSS-REFERENCE TO RELATED APPLICATIONS

This application is a Continuation of PCT International Application No. PCT/JP2019/003135 filed on Jan. 30, 2019, which was published under PCT Article 21(2) in Japanese, and which claims priority under 35 U.S.C. § 119(a) to Japanese Patent Application No. 2018-013543 filed on Jan. 30, 2018. The above applications are hereby expressly incorporated by reference, in their entirety, into the present application.

BACKGROUND OF THE INVENTION

1. Field of the Invention

The present invention relates to a laminate.

2. Description of the Related Art

From the related art, a circularly polarizing plate in which a linear polarizing plate and a λ/4 plate are laminated to prevent reflection of external light has been used in a display device typified by an organic light emitting diode (OLED).

In a polarizer in such a linear polarizing plate, iodine which is a dichroic substance has been widely used (JP2006-317747A).

SUMMARY OF THE INVENTION

A circularly polarizing plate in which a linear polarizing plate and a λ/4 plate are laminated as mentioned above is used in order to prevent reflection of an organic electroluminescent display panel (hereinafter also referred to as a "display panel") having a metal electrode and an organic light emitting layer.

On the other hand, it is required that light generated from an organic light emitting layer be easily transmitted to a visual recognition side of a display panel in order to make a clear pattern (an image, a character, or the like) displayed on the display panel. Examples of a countermeasure against this problem include a method in which an optical film including a light absorption anisotropic film and having a high transmittance is used instead of a linear polarizing plate in the related art.

However, the present inventors have discovered that a new problem arises in a case where the optical film as above, having excellent transparency to light generated from the light emitting layer, is used. That is, a part of the light emitted from the visual recognition side of the optical film is incident onto metal electrode included in the display panel. Further, a part of the reflected light of the light incident on the metal electrode transmits the optical film. At this time, there was a problem that light transmitted through the optical film (reflected light from the metal electrode) appears colored.

Therefore, an object of the present invention is to provide a laminate in which the coloring of reflected light is reduced.

The present inventors have conducted extensive studies on the problem, and as a result, they have found that in a laminate in which an optical film having a light absorption anisotropic film formed using a composition including a dichroic substance and having a high transmittance, a λ/4 plate, and a metal electrode are laminated, in a case where the relationship between a degree of polarization at a specific wavelength of the optical film and a reflectance of the metal electrode at a specific wavelength satisfies a predetermined relationship, the coloring of the reflected light can be reduced, thereby leading to the present invention.

That is, the present inventors have found that the object can be accomplished by the following configuration.

[1] A laminate comprising:
an optical film having a light absorption anisotropic film formed using a composition including a dichroic substance and having a transmittance of more than 50% in a wavelength range of 400 to 700 nm;
a λ/4 plate; and
a metal electrode in this order,
in which in a case where a degree (%) of polarization at a wavelength of λ of the optical film is defined as P(λ) and a reflectance (%) at the wavelength of λ of the metal electrode is defined as R(λ), Formula (A) is satisfied, $$100 \times [\min\{R(450)/P(450), R(550)/P(550), R(650)/P(650)\}/\max\{R(450)/P(450), R(550)/P(550), R(650)/P(650)\}] > 85\% \quad \text{Formula (A)},$$

provided that in Formula (A), min{R(450)/P(450), R(550)/P(550), R(650)/P(650)} and max{R(450)/P(450), R(550)/P(550), R(650)/P(650)} mean a minimum value and a maximum value of R(450)/P(450), R(550)/P(550), and R(650)/P(650), respectively.

[2] The laminate as described in [1],
in which in Formula (A), R(550)/P(550) corresponds to neither min{R(450)/P(450), R(550)/P(550), R(650)/P(650)} nor max{R(450)/P(450), R(550)/P(550), R(650)/P(650)}.

[3] The laminate as described in [1] or [2],
in which in Formula (A),
R(450)/P(450) corresponds to min{R(450)/P(450), R(550)/P(550), R(650)/P(650)}, and
R(650)/P(650) corresponds to max{R(450)/P(450), R(550)/P(550), R(650)/P(650)}.

[4] The laminate as described in any one of [1] to [3], in which the optical film has a maximum value of the degrees of polarization at 555 to 700 nm and satisfies P(450)<P(550).

[5] The laminate as described in any one of [1] to [4],
in which the dichroic substance includes a compound represented by Formula (1) which will be described later,
in Formula (1) which will be described later, $A^1$, $A^2$, and $A^3$ each independently represent a divalent aromatic group which may have a substituent,
in Formula (1) which will be described later, $L^1$ and $L^2$ each independently represent a substituent,
in Formula (1) which will be described later, m represents an integer of 1 to 4, and in a case where m is an integer of 2 to 4, a plurality of $A^2$'s may be the same as or different from each other.

[6] The laminate as described in any one of [1] to [5],
in which the dichroic substance includes a compound represented by Formula (2) which will be described later,
in Formula (2) which will be described later, $A^4$ represents a divalent aromatic group which may have a substituent,
in Formula (2) which will be described later, $L^3$ and $L^4$ each independently represent a substituent,
in Formula (2) which will be described later, E represents any one of a nitrogen atom, an oxygen atom, or a sulfur atom,
in Formula (2) which will be described later, $R^1$ represents a hydrogen atom, a halogen atom, an alkyl group which may have a substituent, or an alkoxy group which may have a substituent, in Formula (2) which will be described later, $R^2$ represents a hydrogen atom or an alkyl group which may have a substituent, in Formula (2) which will be described later, $R^3$ represents a hydrogen atom or a substituent, and in Formula (2) which will be described later, n represents 0 or 1, provided that in a case where E is the nitrogen atom, n is 1, and in a case where E is an oxygen atom or a sulfur atom, n is 0.

[7] The laminate as described in any one of [1] to [6], in which a content of the dichroic substance is 25% by mass or less with respect to a total mass of all solid contents of the composition.

[8] The laminate as described in any one of [1] to [7], in which the λ/4 plate exhibits reciprocal wavelength dispersibility.

[9] The laminate as described in any one of [1] to [8], in which the metal electrode is an electrode that sandwiches an organic light emitting layer of an organic electroluminescent display panel.

[10] The laminate as described in any one of [1] to [8], in which the metal electrode is an electrode included in a touch sensor.

As described below, according to the present invention, it is possible to provide a laminate in which the coloring of reflected light is reduced.

DESCRIPTION OF THE PREFERRED EMBODIMENTS

Figure 1:
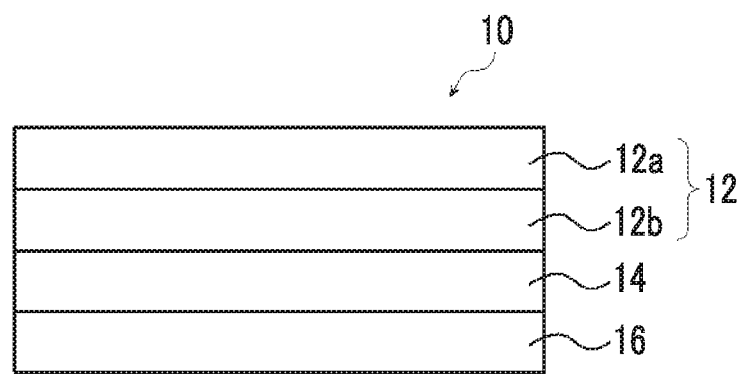
FIG. 1 is a schematic side view showing an embodiment of a laminate of the present invention.

Hereinafter, the present invention will be described in detail.

Description of configuration requirements described below may be made on the basis of representative embodiments of the present invention in some cases, but the present invention is not limited to such embodiments.

Furthermore, in the present specification, a numerical range expressed using "to" is used in a meaning of a range that includes the preceding and succeeding numerical values of "to" as the lower limit value and the upper limit value, respectively.

In addition, in the present specification, "(meth)acryl" means a general term for "acryl" and "methacryl".

In the present invention, Re(λ) and Rth(λ) represent an in-plane retardation and a thickness direction retardation at a wavelength of λ, respectively. Unless otherwise specified, the wavelength of λ is defined as 550 nm.

In the present invention, Re(λ) and Rth(λ) are values measured at a wavelength of λ in AxoScan OPMF-1 (manufactured by Opto Science, Inc.). By inputting an average refractive index ((nx+ny+nz)/3) and a film thickness (d (μm)) to AxoScan, it is possible to calculate:

Slow axis direction (°)

$Re(\lambda)=R0(\lambda)$ $Rth(\lambda)=((nx+ny)/2-nz)\times d$.

In addition, R0(λ) is expressed in a numerical value calculated with AxoScan OPMF-1, but means Re(λ).

In the present specification, the refractive indexes, nx, ny, and nz are measured using an Abbe refractometer (NAR-4T, manufactured by Atago Co., Ltd.) and using a sodium lamp (λ=589 nm) as a light source. In addition, in a case where wavelength dependency is measured, the wavelength dependency can be measured with a multi-wavelength Abbe refractometer DR-M2 (manufactured by Atago Co., Ltd.) in combination with an interference filter.

In addition, the values mentioned in Polymer Handbook (JOHN WILEY & SONS, INC.) and the catalogues of various optical films can be used. The values of the average refractive indexes of major optical films are exemplified below: cellulose acylate (1.48), cycloolefin polymer (1.52), polycarbonate (1.59), polymethyl methacrylate (1.49), and polystyrene (1.59).

In the present specification, angles (for example, an angle of "90°" or the like) and a relationship thereof (for example, "orthogonal" and "parallel") are within an allowable error range in the technical field to which the present invention belongs. For example, the angle means an angle in the range of the exact angle±10°, and the error from the exact angle is preferably 5 or less, and more preferably 3 or less.

[Laminate]

The laminate of an embodiment of the present invention has an optical film having a light absorption anisotropic film formed using a composition including a dichroic substance and having a transmittance of more than 50% in a wavelength range of 400 to 700 nm, a λ/4 plate, and a metal electrode in this order (with these components being laminated).

In the laminate of the embodiment of the present invention, in a case where a degree (%) of polarization at a wavelength of λ of the optical film is defined as PQ) and a reflectance (%) at the wavelength of λ of the metal electrode is defined as R(λ), Formula (A) which will be described later is satisfied.

Hereinafter, one aspect of the laminate of the embodiment of the present invention will be described with reference to the drawings. Further, the drawings in the present invention are all schematic views, and the size and positional relationship of each layer are not necessarily limited to these aspects.

FIG. 1 is a schematic side view showing an embodiment of the laminate of the present invention. A laminate 10 has an optical film 12, a λ/4 plate 14, and a display element 16 having a metal electrode not shown in the drawing, and has the respective members in this order.

The optical film 12 has a transparent support 12a and a light absorption anisotropic film 12b, and the light absorption anisotropic film 12b is disposed on the λ/4 plate 14 side.

The laminate 10 may have an adhesive layer not shown in the drawing between the optical film 12 and the λ/4 plate 14.

The optical film 12 may have a protective layer not shown in the drawing on the surface of the light absorption anisotropic film 12b opposite to the transparent support 12a.

The optical film 12 may have an alignment film not shown in the drawing between the transparent support 12a and the light absorption anisotropic film 12b.

Incidentally, although a case where the optical film 12 has the transparent support 12a has been described, the present invention is not limited thereto, and the optical film in the present invention may not have the transparent support.

[Relationship Between Degree of Polarization and Reflectance]

In a case where the degree (%) of polarization at a wavelength λ of the optical film is defined as P(λ) and the reflectance (%) at a wavelength λ of the metal electrode is defined as R(?), the laminate of the embodiment of the present invention satisfies Formula (A).

$$100 \times [\min\{R(450)/P(450), R(550)/P(550), R(650)/P(650)\}/\max\{R(450)/P(450), R(550)/P(550), R(650)/P(650)\}] > 85\% \quad \text{Formula (A)},$$

It should be noted that in Formula (A), min{R(450)/P(450), R(550)P(550), R(650)/P(650)} and max{R(450)/P(450), R(550)/P(550), R(650)/P(650)} mean a minimum value and a maximum value of R(450)/P(450), R(550)/P(550), and R(650)/P(650), respectively.

Hereinafter, the value of "R(450)/P(450)" is abbreviated as "X", the value of "R(550)/P(550)" is abbreviated as "Y", and the value of "R(650)/P(650)" is abbreviated as "Z".

Accordingly, Formula (A) can also be read as 100×{min(X, Y, Z)/max(X, Y, Z)}>85%.

In addition, a value calculated by 100×(min(X, Y, Z)/max(X, Y, Z)) which is Formula (A) is abbreviated as "A".

P(λ) which is a degree (%) of polarization at a wavelength of λ of the optical film is a value determined by a formula described in the section of Examples which will be described later, based on the transmittance of the optical film.

R(λ) which is a reflectance (%) at a wavelength of λ of the metal electrode is determined from a reflection spectrum measured by a spectrophotometer, using a vapor deposition film of a metal constituting the metal electrode formed on a polyester film.

In the laminated body 10 shown in FIG. 1, in a case where the surface of the optical film 12 opposite to the λ/4 plate 14 side (that is, the transparent support 12a side) is the visual recognition side, a part of light incident from the surface of the transparent support 12a transmits the optical film 12 and the λ/4 plate 14, and reaches the metal electrode in the display element 16. In this case, in a case where a part of the reflected light which is incident on the metal electrode and reflected transmits the optical film 12, the reflected light of the metal electrode is visually recognized by an observer.

Figure 2:
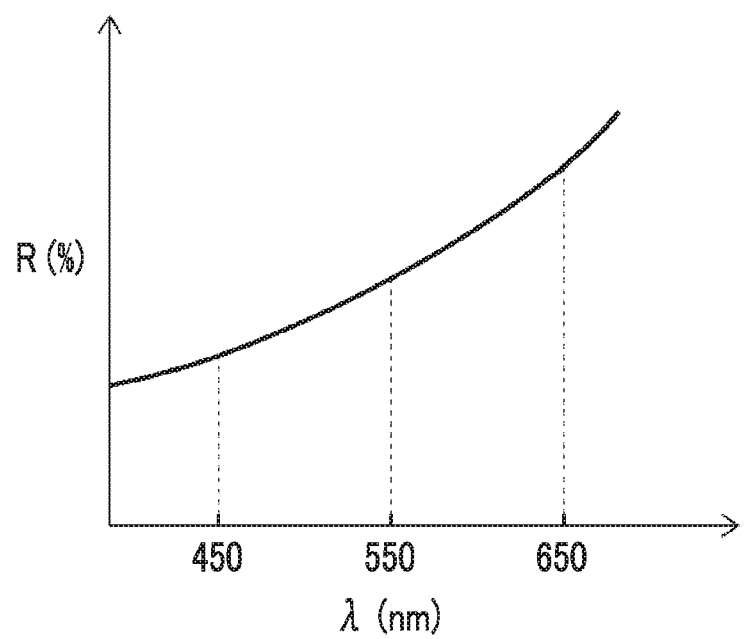
FIG. 2 is a graph showing a reflection spectrum of a general metal.

Here, FIG. 2 is an example of a reflection spectrum of a general metal, in which the vertical axis indicates a reflectance R(%) and the horizontal axis indicates a wavelength λ (nm). As shown in FIG. 2, the reflection spectrum of a metal in the visible light region (400 to 700 nm) tends to increase as the wavelength shifts to the longer wavelength side. Thus, according to the reflection spectrum of FIG. 2, the reflected light of the metal has a strong red tint.

Typically, in a case where an optical film having a low light transmittance is used, the reflected light of the metal electrode is absorbed by the absorption axis of the dichroic substance of the light absorption anisotropic film, and therefore, a problem of coloring of the reflected light hardly occurs.

In contrast, in a case where an optical film having a high light transmittance is used to display a clear image from an image display device, a part of the reflected light of the metal electrode is not absorbed by the absorption axis of the dichroic substance of the light absorption anisotropic film and transmits the visual recognition side of the optical film, and therefore, there is a problem that more colored light is observed by an observer.

With regard to the problem, the present inventors have found that in a case where a degree of polarization of an optical film is adjusted at every wavelength in accordance with a reflection spectrum of a metal constituting a metal electrode, the coloring of the reflected light of the metal electrode can be suppressed.

Figure 3:
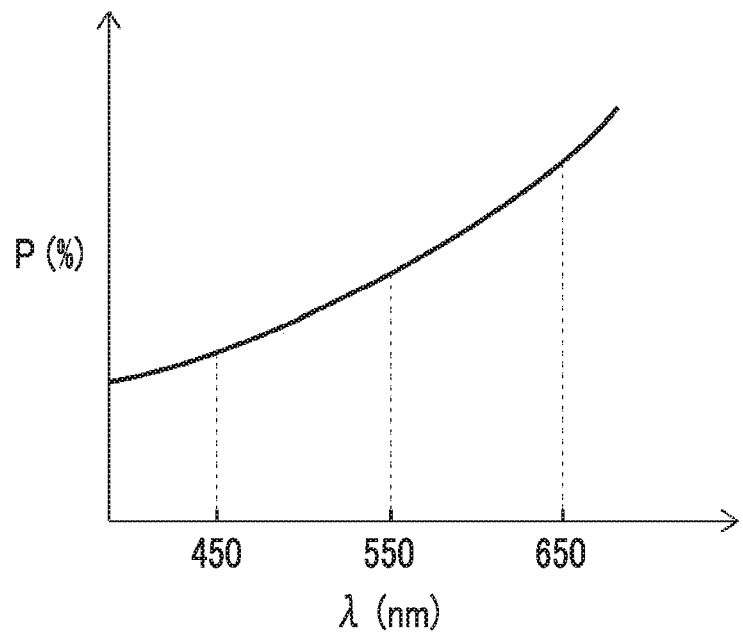
FIG. 3 is a graph showing a degree of polarization of an optical film at every wavelength.

Here, FIG. 3 is a graph showing a degree P(%) of polarization of the optical film at every wavelength. As shown in FIG. 3, in a case where an optical film whose degree of polarization P increases as the wavelength shifts to the longer wavelength side is used, it becomes easy for the optical film (dichroic substance) to absorb light on the longer wavelength side.

Figure 4:
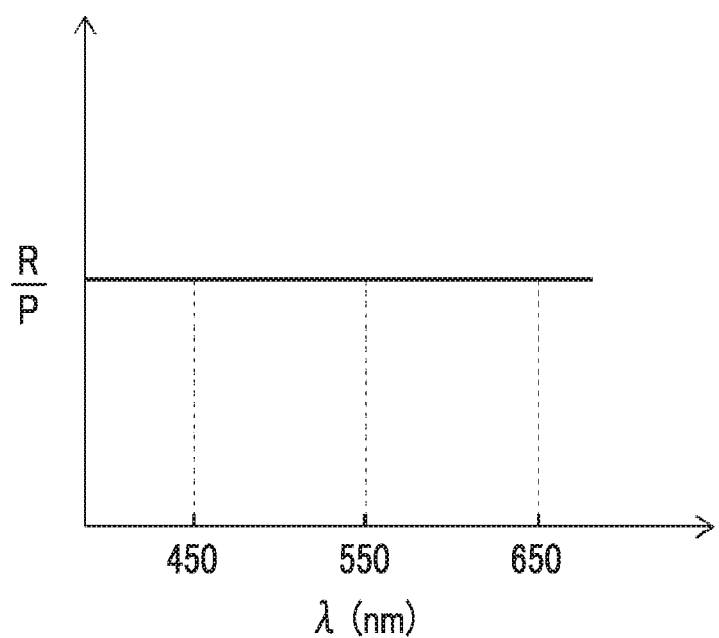
FIG. 4 is a graph showing a value obtained by dividing a reflectance of a metal by a degree of polarization of an optical film at every wavelength.

That is, as shown in FIG. 4, it is presumed that in a case where a value (R/P) obtained by dividing a reflectance R(%) of a metal by a degree P(%) of polarization of the optical film has a similar value at every wavelength, the coloring of the reflected light which transmits the optical film and is visually recognized can be suppressed.

Based on such viewpoints, the present inventors have found that in a case where representative wavelengths (450 nm, 550 nm, and 650 nm) are selected from the wavelength ranges of blue, green, and red, which are the three primary colors of light, and a variation in an R/P value at every wavelength (that is, X, Y, and Z) in Formula (A) is small, the coloring of the reflected light which transmits the optical film and is visually recognized can be suppressed. Specifically, in a case where the ratio of the minimum value (min(X, Y, Z)) to the maximum value (max(X, Y, Z)) among X, Y, and Z in Formula (A) is 85% or more, a state where the difference in R/P at every wavelength as shown in FIG. 4 is a small is likely to be created, and therefore, the coloring of reflected light that transmits the optical film and is visually recognized can be suppressed.

A is 85% or more, and from the viewpoint that the coloring of reflected light can be further suppressed, A is preferably 88% or more, and particularly preferably 90% or more. An upper limit value of A is preferably 100% or less.

It is preferable that Y corresponds to neither min(X, Y, Z) nor max(X, Y, Z). That is, it is preferable that among X, Y, and Z, Y is the intermediate value. Y is a value corresponding to a wavelength that is easily visually recognized by human eyes. Therefore, in a case where Y is an intermediate value which corresponds to neither the maximum value nor the minimum value, it becomes difficult for the coloring of the reflected light to be visually recognized.

Furthermore, it is preferable that X corresponds to min(X, Y, Z) and Z corresponds to max(X, Y, Z). That is, it is preferable that a relationship of X<Y<Z is satisfied. Thus, the coloring of the reflected light is further suppressed.

It is preferable that the optical film has a maximum value of the degree of polarization at 555 to 700 nm and satisfies P(450)<P(550). Thus, the degree of polarization P at every wavelength of the optical film corresponds to a reflection spectrum of a general metal whose reflectance R increases as the wavelength shifts to the longer wavelength side. Therefore, the coloring of the reflected light is further suppressed.

Hereinafter, each of the members constituting the laminate of the embodiment of the present invention will be described.

[Optical Film]

The optical film has a transmittance in the wavelength range of 400 to 700 nm which is more than 50%, and the transmittance is preferably 52% or more, and particularly preferably 55% or more. Thus, a clear pattern can be displayed on the display panel.

The transmittance of the optical film in the present specification refers to a transmittance which is based on the transmittance of the optical film in a wavelength range of 400 to 700 in, using a TAC base material as a reference to suppress the influence of surface reflection, and is visibility-corrected with reference to a standard relative visibility as defined by International Illumination Committee (CIE). In addition, the details of the measuring device and the measuring method for the transmittance of the optical film are as shown in the section of Examples which will be described later.

Examples of a method for adjusting the transmittance of the optical film to 50% or more include, but not limited to, a method in which an organic colorant (in particular, a specific dichroic substance which will be described later) is used as the dichroic substance included in the light absorption anisotropic film.

The degree of polarization of the optical film can be adjusted with, for example, the type of the dichroic substance, the content of the dichroic substance in the light absorption anisotropic film, a blend ratio of the respective dichroic substances in a case where a plurality of the dichroic substances are used, and the like.

<Light Absorption Anisotropic Film>

The optical film has a light absorption anisotropic film. The light absorption anisotropic film is a film formed using a composition including a dichroic substance. The optical film has a function as a linearly polarizing plate which extracts linearly polarized light.

(Dichroic Substance)

The dichroic substance is not particularly limited as long as it makes it possible to obtain an optical film having a high light transmittance (a light transmittance of 50% or more), but from the viewpoint of excellent alignment, it preferably includes a compound (hereinafter also abbreviated as a "specific dichroic substance") represented by Formula (1).

The light absorption anisotropic film may include the dichroic substance as it is or a polymer of the dichroic substance, or may also include both thereof.

(1)

Here, in Formula (1), $A^1$, $A^2$, and $A^3$ each independently represent a divalent aromatic group which may have a substituent.

Furthermore, in Formula (1), $L^1$ and $L^2$ each independently represent a substituent.

In addition, in Formula (1), m represents an integer of 1 to 4, and in a case where m is an integer of 2 to 4, a plurality of $A^2$'s may be the same as or different from each other. Further, m is preferably 1 or 2.

In Formula (1), the "divalent aromatic group which may have a substituent", represented by each of $A^1$, $A^2$, and $A^3$ will be described.

Examples of the substituent include the substituent group G described in paragraphs [0237] to [0240] of JP2011-237513A, and among these, a halogen atom, an alkyl group, an alkoxy group, an alkoxycarbonyl group (for example, methoxycarbonyl and ethoxycarbonyl), or an aryloxycarbonyl group (for example, phenoxycarbonyl, 4-methylphenoxycarbonyl, 4-methoxyphenylarbonyl), or the like is preferable, the alkyl group is more preferable, and an alkyl group having 1 to 5 carbon atoms are particularly preferable.

On the other hand, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among those, the phenylene group is preferable.

Furthermore, as the divalent aromatic heterocyclic group, a monocyclic or bicyclic heterocycle-derived group is preferable. Examples of an atom constituting the aromatic heterocyclic group, other than carbon, include a nitrogen atom, a sulfur atom, and an oxygen atom. In a case where the aromatic heterocyclic group has a plurality of atoms constituting a ring other than carbon, these may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadiazolediyl group, a phthalimidediyl group, and a thienothiazolediyl group (hereinafter abbreviated as a "thienothiazole group").

Among the divalent aromatic groups, the divalent aromatic hydrocarbon group is preferable.

Here, it is preferable that any one of $A^1$, $A^2$, or $A^3$ is a divalent thienothiazole group which may have a substituent. Further, specific examples of the substituent of the divalent thienothiazole group include the same ones as those of the substituent in the "divalent aromatic group which may have a substituent" as mentioned above, and preferred aspects thereof are also the same.

Furthermore, it is more preferable that $A^2$ out of $A^1$, $A^2$, and $A^3$ is a divalent thienothiazole group. In this case, $A^1$ and $A^2$ each represent a divalent aromatic group which may have a substituent.

In a case where $A^2$ is the divalent thienothiazole group, it is preferable that at least one of $A^1$ or $A^2$ is a divalent aromatic hydrocarbon group which may have a substituent, and it is more preferable that both $A^1$ and $A^2$ are divalent aromatic hydrocarbon groups which may have a substituent.

In Formula (1), the "substituent" represented by each of $L^1$ and $L^2$ will be described.

As the substituent, a group introduced to enhance solubility or nematic liquid crystallinity, a group having an electron-donating property or an electron-withdrawing property introduced to adjust the color tone of a colorant, or a group having a crosslinkable group (polymerizable group) to be introduced to fix alignment is preferable.

For example, examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, such as a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, such as a vinyl group, an allyl group, a 2-butenyl group, and a 3-pentenyl group), an alkynyl group (preferably an alkynyl group having 2 to 20 carbon atoms, more preferably a n alkynyl group having 2 to 12 carbon atoms, and particularly preferably an alkynyl group having 2 to 8 carbon atoms, such as a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, such as a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, such as an unsubstituted amino group, a methylamino group, a dimethylamino group, a diethylamino group, and an anilino group), an alkoxy group (preferably an alkoxy group having 1 to 20 carbon atoms, and more preferably an alkoxy group having 1 to 15 carbon atoms, such as a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, such as a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, such as an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, such as an acetylamino group and a benzoylamino group), an alkoxycarbonylamino group (preferably an alkoxycarbonylamino group having 2 to-20 carbon atoms, more preferably an alkoxycarbonylamino group having 2 to 10 carbon atoms, and particularly preferably an alkoxycarbonylamino group having 2 to 6 carbon atoms, such as a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, such as a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, such as a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, such as a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, such as an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, such as a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, such as a phenylthio group, a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, such as a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, such as a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, such as an unsubstituted ureido group, a methylureido group, and a phenylureido group), a phosphoric amide group (preferably a phosphoric amide group having 1 to 20 carbon atoms, more preferably a phosphoric amide group having 1 to 10 carbon atoms, and particularly preferably a phosphoric amide group having 1 to 6 carbon atoms, such as a diethylphosphoramide group and a phenylphosphoramide group), a hydroxyl group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms, and more preferably a heterocyclic group having 1 to 12 carbon atoms, such as a heterocyclic group having a heteroatom such as a nitrogen atom, an oxygen atom, and a sulfur atom, such as an epoxy group, an oxetanyl group, an imidazolyl group, a pyridyl group, a quinolyl group, a furyl group, a piperidyl group, a morpholino group, a benzoxazolyl group, a benzimidazolyl group, and a benzthiazolyl group), and a silyl group (preferably a silyl group having 3 to 40 carbon atoms, more preferably a silyl group having 3 to 30 carbon atoms, and particularly preferably a silyl group having 3 to 24 carbon atoms, such as a trimethylsilyl group and a triphenylsilyl group).

These substituents may further be substituted with these substituents. In addition, in a case where two or more of the substituents are included, the substituents may be the same as or different from each other. Further, if possible, the substituents may be bonded to each other to form a ring.

The substituent represented by each of $L^1$ and $L^2$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxyl group, a cyano group, an imino group, an azo group, a halogen atom, or a heterocyclic group, and more preferably the alkyl group which may have a substituent, the alkenyl group which may have a substituent, the aryl group which may have a substituent, the alkoxy group which may have a substituent, the oxycarbonyl group which may have a substituent, the acyloxy group which may have a substituent, the amino group which may have a substituent, the nitro group, the imino group, or the azo group.

It is preferable that at least one of $L^1$ or $L^2$ includes a crosslinkable group (polymerizable group), and it is more preferable that both of $L^1$ and $L^2$ include a crosslinkable group.

Specific examples of the crosslinkable group include polymerizable groups described in paragraphs [0040] to [0050] of JP2010-244038A, and from the viewpoints of reactivity and synthesis suitability, an acryloyl group, a methacryloyl group, an epoxy group, an oxetanyl group, or a styryl group is preferable, and the acryloyl group or the methacryloyl group is more preferable.

Suitable aspects of $L^1$ and $L^2$ include an alkyl group substituted with the crosslinkable group, dialkylamino group substituted with the crosslinkable group, and an alkoxy group substituted with the crosslinkable group.

In the present invention, for a reason that a degree of alignment of the specific dichroic substance included in the light absorption anisotropic film is further improved, it is preferable that the specific dichroic substance is a compound represented by Formula (2).

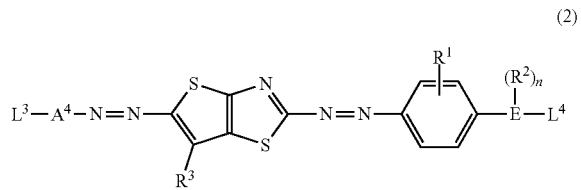

(2)

Here, in Formula (2), $A^4$ represents a divalent aromatic group which may have a substituent.

Furthermore, in Formula (2), L and $L^4$ each independently represent a substituent.

Moreover, in Formula (2), E represents any one of a nitrogen atom, an oxygen atom, or a sulfur atom.

In addition, in Formula (2), $R^1$ represents a hydrogen atom, a halogen atom, an alkyl group which may have a substituent, or an alkoxy group which may have a substituent.

Furthermore, in Formula (2), $R^2$ represents a hydrogen atom or an alkyl group which may have a substituent.

Moreover, in Formula (2), $R^3$ represents a hydrogen atom or a substituent.

In addition, in Formula (2), n represents 0 or 1. It should be noted that in a case where E is the nitrogen atom, n is 1, and in a case where E is oxygen atom or a sulfur atom, n is 0.

In Formula (2), specific examples and suitable aspects of the "divalent aromatic group which may have a substituent" represented by $A^4$ include the same ones as those of the "divalent aromatic group which may have a substituent" represented by each of $A^1$ to $A^3$ in Formula (1).

A preferred aspect of $A^4$ is a phenylene group.

Specific examples and suitable aspects of the "substituent" represented by each of $L^3$ and $L^4$ in Formula (2) include the same ones as those of the "substituent" represented by each of $L^1$ and $L^2$ in Formula (1).

A suitable aspect of each of $L^3$ and $L^4$ is that at least one of $L^3$ or $L^4$ includes a crosslinkable group, and a more suitable aspect thereof is that both $L^3$ and L include a crosslinkable group. Thus, the degree of alignment of the specific dichroic substance included in the light absorption anisotropic film is further improved, and the high-temperature durability and the moisture-heat resistance of the laminate become better.

In addition, a suitable aspect of the crosslinkable group of each of $L^3$ and $L^4$ is an acryloyl group or a methacryloyl group.

In Formula (2), E represents any one of a nitrogen atom, an oxygen atom, or a sulfur atom, and from the viewpoint of synthesis suitability, E is preferably the nitrogen atom.

Further, from the viewpoint that it becomes easy to make the specific dichroic substance have an absorption on the short wavelength side (for example, a substance having a maximum absorption wavelength in the vicinity of 500 to 530 nm), it is preferable that E in Formula (1) is an oxygen atom.

On the other hand, from the viewpoint that it becomes easy to make the specific dichroic substance have an absorption on the long wavelength side (for example, a substance having a maximum absorption wavelength in the vicinity of 600 nm), it is preferable that E in Formula (1) is a nitrogen atom.

In Formula (2), $R^1$ represents a hydrogen atom, a halogen atom, an alkyl group which may have a substituent, or an alkoxy group which may have a substituent, and is preferably the hydrogen atom or the alkyl group which may have a substituent is preferable.

Next, the "alkyl group which may have a substituent" and the "alkoxy group which may have a substituent" represented by $R^1$ will be described.

Examples of the substituent include a halogen atom.

Examples of the alkyl group include a linear, branched, or cyclic alkyl group having 1 to 8 carbon atoms. Among those, a linear alkyl group having 1 to 6 carbon atoms is preferable, a linear alkyl group having 1 to 3 carbon atoms is more preferable, and a methyl group or an ethyl group is still more preferable.

Examples of the alkoxy group include an alkoxy group having 1 to 8 carbon atoms. Among those, an alkoxy group having 1 to 6 carbon atoms is preferable, an alkoxy group having 1 to 3 carbon atoms is more preferable, and a methoxy group or an ethoxy group is particularly preferable.

In Formula (2), $R^2$ represents a hydrogen atom or an alkyl group which may have a substituent, and is preferably an alkyl group which may have a substituent.

Specific examples and suitable aspects of the "alkyl group which may have a substituent" represented by $R^2$ include the same ones as those of the above-mentioned "alkyl group which may have a substituent" in $R^1$ of Formula (2), and thus, a description thereof will be omitted.

In addition, in a case where E is the nitrogen atom, $R^2$ is a group which is present in Formula (2) (that is, it means a case where n=1). On the other hand, in a case where E is an oxygen atom or a sulfur atom, $R^2$ is a group which is not present in Formula (2) (that is, it means a case where n=0).

In Formula (2), $R^3$ represents a hydrogen atom or a substituent.

Specific examples and suitable aspects of the "substituent" represented by $R^3$ include the same ones as those of the above-mentioned "divalent aromatic group which may have a substituent", preferred aspects thereof are also the same, and thus, a description thereof will be omitted.

In Formula (2), n represents 0 or 1. It should be noted that in a case where E is the nitrogen atom, n is 1, and in a case where E is an oxygen atom or a sulfur atom, n is 0.

Specific examples of the specific dichroic substance represented by Formula (1) include the compounds described in paragraphs [0051] to [0081] of JP2010-152351A, the contents of which is incorporated herein by reference.

Among those, suitable examples of the specific dichroic substance having the structure represented by Formula (2) also include compounds (D-54) to (D-58) shown below, in addition to the compounds (D-1) to (D-53) described in paragraphs [0074] to [0081] of JP2010-152351A.

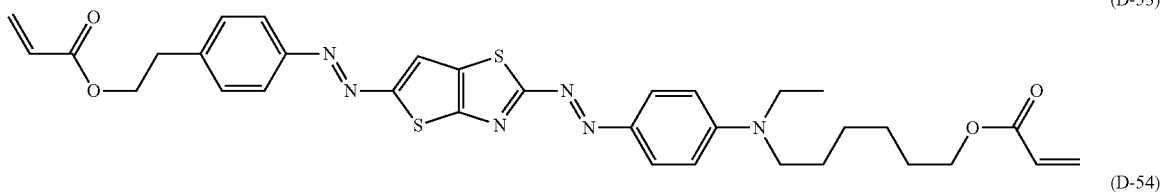
(D-53)

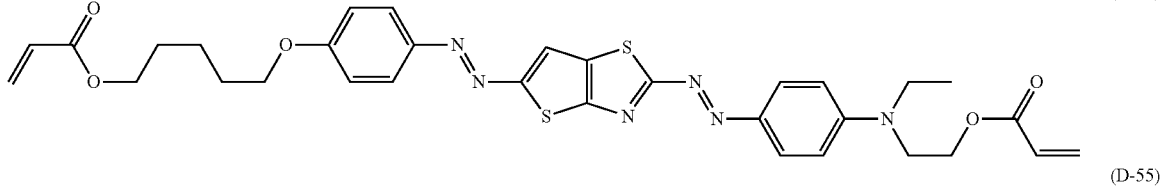
(D-54)

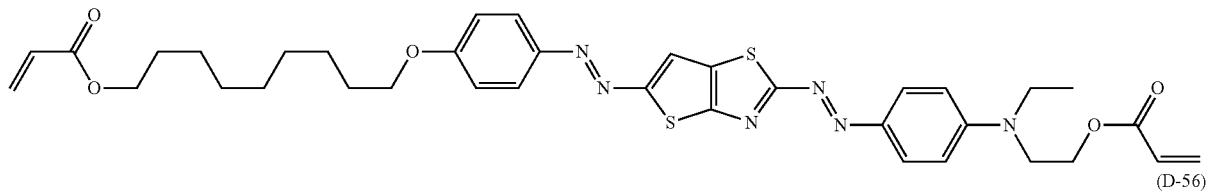
(D-55)

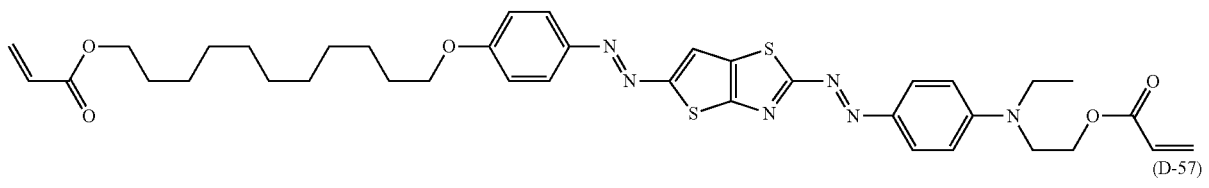
(D-56)

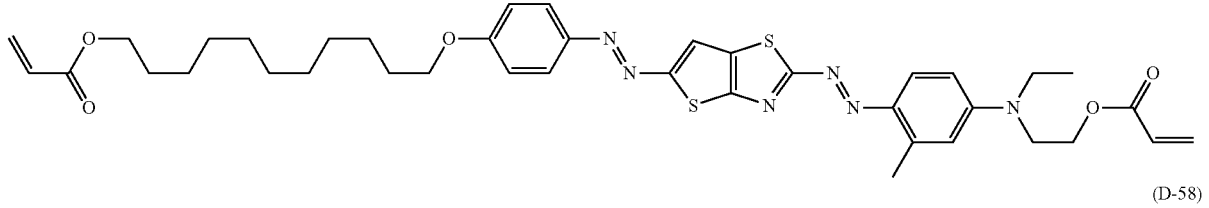
(D-57)

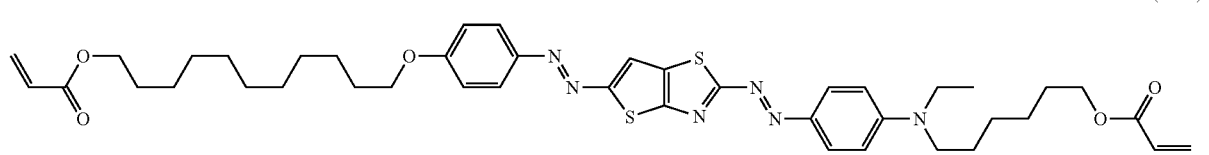
(D-58)

The content of the dichroic substance is preferably 25% by mass or less, more preferably 20% by mass or less, and particularly preferably 18% by mass or less, with respect to a total mass of all the solid contents in the composition. In addition, a lower limit value of the content of the dichroic substance is preferably 5% by mass or more, more preferably 8% by mass or more, and particularly preferably 10% by mass or more, with respect to a total mass of all the solid contents in the composition.

In a case where the content of the dichroic substance is 25% by mass or less, a film having high light transmittance can be obtained, and therefore, a clear pattern (for example, an image and a character) can be displayed on a display panel. In addition, with the content of the dichroic substance of 5% by mass or more, in a case where the optical film is used as an antireflection film, a function thereof is sufficiently exhibited i.

In the present invention, it is preferable that the light absorption anisotropic film is a film formed using a composition (hereinafter also referred to as a "liquid crystalline composition") including a liquid crystalline compound together with the above-mentioned dichroic substance for a reason that the dichroic substance can be aligned at a higher degree of alignment while restraining the dichroic substance from being precipitated.

(Liquid Crystalline Compound)

As the liquid crystalline compound included in the liquid crystalline composition, both of a low-molecular liquid crystalline compound and a high-molecular liquid crystalline compound can be used.

Here, the "low-molecular liquid crystalline compound" refers to a liquid crystalline compound having no repeating unit in the chemical structure.

In addition, the "high-molecular liquid crystalline compound" refers to a liquid crystalline compound having a repeating unit in the chemical structure.

Examples of the low-molecular liquid crystalline compound include those described in JP2013-228706A.

Examples of the high-molecular liquid crystalline compound include the thermotropic liquid crystalline polymers described in JP2011-237513A. In addition, the high-molecular liquid crystalline compound may have a crosslinkable group (for example, an acryloyl group and a methacryloyl group) at a terminal.

(Interface Modifier)

The liquid crystalline composition preferably includes an interface modifier. By incorporation of the interface modifier, the smoothness of the coating surface is improved, and improvement of the degree of alignment and improvement of the in-plane uniformity through suppression of cissing and unevenness are anticipated.

As the interface modifier, an interface modifier having a liquid crystalline compound placed horizontal on the coated surface is preferable, and the compounds (horizontal alignment agents) described in paragraphs [0253] to [0293] of JP2011-237513A can be used.

In a case where the liquid crystalline composition includes the interface modifier, the content of the interface modifier is preferably 0.001 to 5 parts by mass, and more preferably 0.01 to 3 parts by mass, with respect to 100 parts by mass of the total amount of the dichroic substance and the liquid crystalline compound in the liquid crystalline composition.

(Polymerization Initiator)

The liquid crystalline composition may include a polymerization initiator.

The polymerization initiator is not particularly limited, but is preferably a photosensitive compound, that is, a photopolymerization initiator.

As the photopolymerization initiator, various compounds can be used with no particular limitation. Examples of the photopolymerization initiator include α-carbonyl compounds (each of the specifications of U.S. Pat. Nos. 2,367,661A and 2,367,670A), acyloin ethers (the specification of U.S. Pat. No. 2,448,828A), aromatic acyloin compounds substituted with α-hydrocarbon (the specification of U.S. Pat. No. 2,722,512A), polynuclear quinone compounds (each of the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (JP1985-105667A (JP-S60-105667A) and the specification of U.S. Pat. No. 4,239,850A), oxadiazole compounds (the specification of U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization initiator, and examples thereof include IRGACURE 184, IRGACURE 907, IRGACURE 369, IRGACURE 651, IRGACURE 819, and IRGACURE OXE-01, all manufactured by BASF.

In a case where the liquid crystalline composition of the present invention includes a polymerization initiator, the content of the polymerization initiator is preferably 0.01 to 30 parts by mass, and more preferably 0.1 to 15 parts by mass with respect to 100 parts by mass of the total amount of the dichroic substance and the liquid crystalline compound in the liquid crystalline composition. In a case where the content of the polymerization initiator is 0.01 parts by mass or more, the curability of the light absorption anisotropic film becomes good, whereas in a case where the content of the polymerization initiator is 30 parts by mass or less, the alignment of the light absorption anisotropic film becomes better.

(Solvent)

The liquid crystalline composition preferably includes a solvent from the viewpoint of workability or the like.

Examples of the solvent include organic solvents such as ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, benzene, toluene, xylene, and trimthylbenzcne), halogenated carbons (for example, dichloromethane, trichloromethane, dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, the organic solvents are preferably used, and the halogenated carbons or the ketones are more preferably used.

In a case where the liquid crystalline composition includes a solvent, the content of the solvent is preferably 80% to 99% by mass, more preferably 83% to 97% by mass, and particularly preferably 85% to 95% by mass with respect to the total mass of the liquid crystalline composition.

(Other Components)

The liquid crystalline composition may further include a dichroic substance other than the specific dichroic substance, and may include a plurality of the specific dichroic substances. In a case where a plurality of the dichroic substances are included, from the viewpoint of further curing the liquid crystalline composition, it is preferable to include a dichroic substance having a crosslinkable group which is crosslinked with the specific dichroic substance, and it is more preferable to include a plurality of the specific dichroic substances.

(Formation Method)

A method for forming a light absorption anisotropic film using the above-mentioned liquid crystalline composition is not particularly limited, and examples thereof include a method including a step of applying the liquid crystalline composition onto a transparent support which will be described later to form a coating film (hereinafter also referred to as a "coating film forming step") and a step of aligning the liquid crystalline component included in the coating film in this order (hereinafter also referred to as an "aligning step").

Furthermore, the liquid crystalline component is a component including not only the above-mentioned liquid crystalline compound but also a liquid crystal dichroic substance in a case where the above-mentioned dichroic substance has liquid crystallinity.

The coating film forming step is a step of forming a coating film by coating the liquid crystalline composition on a transparent support.

It becomes easy to apply a liquid crystalline composition onto the transparent support by using a liquid crystalline composition including the above-mentioned solvent or by using a liquid crystalline composition in the form of a liquid state material such as a melt solution by heating or the like.

Specific examples of a method for applying the liquid crystalline composition include known methods such as a roll coating method, a gravure printing method, a spin coating method, a wire bar coating method, an extrusion coating method, a direct gravure coating method, a reverse gravure coating method, a die coating method, a spray method, and an inkjet method.

In addition, in the present aspect, examples in which a liquid crystalline composition is applied onto a transparent support are shown, but are not limited thereto, and for example, the liquid crystalline composition may be applied onto an alignment film provided on the transparent support. Details of the alignment film will be described later.

The aligning step is a step of aligning the liquid crystalline components included in the coating film. Thus, a light absorption anisotropic film can be obtained.

The aligning step may include a drying treatment. By the drying treatment, components such as a solvent can be removed from the coating film. The drying treatment may be performed by a method of leaving the coating film at room temperature for a predetermined time (for example, natural drying), or may be performed by a method of heating and/or blowing.

Here, the liquid crystalline component included in the liquid crystalline composition may be aligned by the above-mentioned coating film forming step or drying treatment in some cases. For example, in an aspect in which the liquid crystalline composition is prepared as a coating liquid including a solvent, a coating film having light absorption anisotropy (that is, a light absorption anisotropic film) can be obtained by drying the coating film and removing the solvent from the coating film.

In a case where the drying treatment is performed at a temperature no lower than the transition temperature of the liquid crystalline component included in the coating film to a liquid crystal phase, a heating treatment which will be described later may not be carried out.

The transition temperature of the liquid crystalline component included in the coating film to the liquid crystal phase is preferably 10° C. to 250° C., and more preferably 25° C. to 190° C., from the viewpoint of manufacturing suitability and the like. In a case where the transition temperature is 10° C. or higher, a cooling treatment or the like for lowering the temperature to a temperature range in which a liquid crystal phase is exhibited is not required, which is thus preferable. Further, in a case where the transition temperature is 250° C. or lower, a high temperature is not required even in a case where the liquid crystal phase is once brought into an isotropic liquid state at a higher temperature than the temperature range in which a liquid crystal phase is exhibited, which is thus preferable since waste of heat energy, and deformation, deterioration, or the like of a substrate can be reduced.

The aligning step preferably has a heating treatment. By the heating treatment, the liquid crystalline component included in the coating film can be aligned, and therefore, the coating film after the heating treatment can be suitably used as the light absorption anisotropic film.

The heating temperature is preferably performed at 10° C. to 250° C., and more preferably performed at 25° C. to 190° C., from the viewpoint of manufacturing suitability and the like. In addition, the heating time is preferably 1 to 300 seconds, and more preferably 1 to 60 seconds.

The aligning step may have a cooling treatment which is carried out after the heating treatment. The cooling treatment is a treatment for cooling the heated coating film to approximately room temperature (20° C. to 25° C.). By the cooling treatment, the alignment of the liquid crystalline component included in the coating film can be fixed. The cooling unit is not particularly limited, and can be carried out by a known method.

Through the above steps above, a light absorption anisotropic film can be obtained.

In addition, in the present aspect, examples of the method for aligning the liquid crystalline component included in the coating film include, but not limited to, the drying treatment, the heating treatment, and the like, and the method can be carried out by a known alignment treatment.

A method for producing the light absorption anisotropic film may have a step of curing the light absorption anisotropic film after the aligning step (hereinafter also referred to as a "curing step").

For example, in a case where the light absorption anisotropic film has a crosslinkable group (polymerizable group), the curing step is carried out by heating and/or light irradiation (exposure). Among those, the curing step is preferably carried out by light irradiation.

Various light sources such as infrared light, visible light, and ultraviolet rays can be used as a light source for curing, but the ultraviolet rays are preferable. Further, the ultraviolet rays may be irradiated while heating at the time of curing or the ultraviolet rays may be irradiated through a filter which transmits only a specific wavelength.

In a case where the exposure is performed while heating, the heating temperature at the time of exposure depends on the transition temperature of the liquid crystalline component included in the light absorption anisotropic film to the liquid crystal phase, but is preferably 25° C. to 140° C.

In addition, the exposure may be performed in a nitrogen atmosphere. In a case where curing of the light absorption anisotropic film proceeds by radical polymerization, it is preferable that exposure is performed in a nitrogen atmosphere since inhibition of polymerization by oxygen is reduced.

The thickness of the light absorption anisotropic film is not particularly limited, but is preferably 0.1 to 5.0 µm, and more preferably 0.3 to 1.5 µm.

<Transparent Support>

The optical film may have a transparent support. In a case where the optical film has a transparent support, the transparent support is disposed between the light absorption anisotropic film and the λ/4 plate.

Here, in the present specification, "transparent" indicates that the transmittance of visible light is 60% or more, preferably 80% or more, and particularly preferably 90% or more.

Examples of a material for forming the transparent support include polycarbonate-based polymers; polyester-based polymers such as polyethylene terephthalate (PET) and polyethylene naphthalate; acrylic polymers such as polymethyl methacrylate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as a nylon and an aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers, vinyl butyral-based polymers; arylate-based polymers; polyoxymethylene-based polymers; and epoxy-based polymers.

Furthermore, as the material for forming the transparent support, a thermoplastic norbornene-based resin is also preferable. Examples of the thermoplastic norbornene-based resin include ZEONEX and ZEONOR, both manufactured by Zeon Corporation, and ARTON manufactured by JSR Corporation.

In addition, as the material for forming the transparent support, a cellulosic polymer typified by triacetyl cellulose (TAC) is also preferable.

A thickness of the transparent support is not particularly limited, and is preferably 100 μm or less, more preferably 80 μm or less, and particularly preferably 10 to 80 sm.

[λ/4 Plate]

The λ/4 plate included in the laminate of the embodiment of the present invention is disposed between the optical film and the metal electrode. In the laminate of the embodiment of the present invention, a combination of an optical film and a λ/4 plate can be used as a circularly polarizing plate.

Here, the "4 plate" is a plate having a λ/4 function, specifically, a plate having a function of converting linearly polarized light at a certain specific wavelength into circularly polarized light (or converting circularly polarized light into linearly polarized light).

Specific examples of the λ/4 plate include US2015/0277006A.

For example, specific examples of an aspect in which the λ/4 plate has a monolayer structure include a stretched polymer film and a phase difference film having an optically anisotropic layer having a λ/4 function provided on a support, and specific examples of an aspect in which the λ/4 plate has a multilayer structure include a broadband λ/4 plate obtained by laminating a λ/4 plate and a λ/2 plate.

An Re(550) of the λ/4 plate is not particularly limited, but is preferably 110 to 160 nm, and more preferably 120 to 150 nm, from the viewpoint of usefulness as a λ/4 plate.

The λ/4 plate preferably exhibits reciprocal wavelength dispersibility. Exhibition of the reciprocal wavelength dispersibility of the 4 plate means that an Re value becomes equal or higher as a measurement wavelength is increased in a case where an in-plane retardation (Re) value at a specific wavelength (visible light range) is measured.

[Metal Electrode]

The metal electrode included in the laminate of the embodiment of the present invention is preferably, for example, an electrode included in a display element or an electrode included in a touch sensor.

The display element is an element used for a display device, specific examples thereof include a liquid crystal cell, an organic electroluminescent (hereinafter abbreviated as "EL") display panel, and a plasma display panel, and among these, an organic EL display panel is preferable.

The organic EL display panel is a display panel configured using an organic EL element in which an organic light emitting layer (organic electroluminescence layer) is interposed between metal electrodes (between a cathode and an anode).

The touch sensor is a sensor that senses a change in a capacitance, a pressure, and the like, and is used as a touch panel in a case where applied to the above-mentioned image display device. Specifically, the touch sensor includes an aspect in which a conductive film having a metal electrode disposed on the surface of the film is included.

Examples of a material constituting the metal electrode include a metal element selected from aluminum, chromium, copper, silver, gold, platinum, tantalum, nickel, titanium, molybdenum, tungsten, hafnium, vanadium, niobium, manganese, magnesium, zirconium, beryllium, tin, zinc, indium and the like, and an alloy including one or more of the above-mentioned metal elements.

In addition, as the material constituting the metal electrode, a conductive metal oxide and a metal nitride can be used.

Examples of the metal oxide having conductivity include indium tin oxide, indium oxide including tungsten, indium zinc oxide including tungsten, indium oxide including titanium, indium tin oxide including titanium, indium zinc oxide, and indium tin oxide to which silicon has been added.

Examples of the metal nitride having conductivity include titanium nitride, tantalum nitride, and tungsten nitride.

Among those, as the material constituting the metal, from the viewpoint of conductivity and handleability, a material including silver is preferable, and silver is more preferable.

[Alignment Film]

The laminate of the embodiment of the present invention may have an alignment film between the transparent support and the light absorption anisotropic film.

Examples of a method of forming the alignment film include methods such as a rubbing treatment of an organic compound (preferably a polymer) on a film surface, oblique deposition of an inorganic compound, formation of a layer having microgrooves, and accumulation of an organic compound (for example, ω-tricosanoic acid, dioctadecylmethylammonium chloride, and methyl stearylate) according to a Langmuir-Blodgett method (LB film). In addition, an alignment film in which an alignment function is generated by application of an electric field, application of a magnetic field, or light irradiation is also known.

Among those, in the present invention, from the viewpoint of easy control of a pretilt angle of the alignment film, an alignment film formed by rubbing is preferable, and from the viewpoint of uniformity of alignment, a photo-alignment film formed by light irradiation is also preferable.

<Rubbing-Treated Alignment Film>

A polymer material used for an alignment film formed by a rubbing treatment is described in many documents, and many commercially available products thereof can be obtained. In the present invention, a polyvinyl alcohol or a polyimide, and derivatives thereof are preferably used. With regard to the alignment film, reference can be made to page 43, line 24 to page 49, line 8 of WO01/088574A1. A thickness of the alignment film is preferably 0.01 to 10 μm, and more preferably 0.01 to 1 μm.

<Photo-Alignment Film>

A photo-alignment compound used for an alignment film formed by light irradiation is described in many documents. In the present invention, preferred examples of the photo-alignment compound include the azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, or JP4151746B, the aromatic ester compounds described in JP2002-229039A, the maleimide and/or alkenyl-substituted nadimide compounds having a photo-alignment unit described in JP2002-265541A or JP2002-317013A, the photo-crosslinkable silane derivatives described in JP4205195B or JP4205198B, and the photo-crosslinkable polyimides, polyamides, or polyesters described in JP2003-520878A, JP2004-529220A, or JP4162850B.

Among those, as the photo-alignment compound, a photosensitive compound having a photoreactive group in which at least one of dimerization or isomerization is caused by the action of light is preferably used.

In addition, the photoreactive group preferably has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

The photo-alignment film formed from the material is irradiated with linearly polarized light or non-polarized light to produce a photo-alignment film.

In the present specification, "irradiation of linearly polarized light" and "irradiation of non-polarized light" are each an operation for causing a photoreaction to occur in a photo-alignment material. The wavelength of the light used varies depending on the photo-alignment material used and is not particularly limited as long as it is necessary for the photoreaction. The peak wavelength of light used for light irradiation is preferably 200 to 700 nm, and ultraviolet rays having a peak wavelength of light of 400 nm or less are more preferable.

A light source used for light irradiation may be a commonly used light source, for example, a lamp such as a tungsten lamp, a halogen lamp, a xenon lamp, a xenon flash lamp, a mercury lamp, a mercury xenon lamp, and a carbon arc lamp, various lasers [for example, a semiconductor laser, a helium neon laser, an argon ion laser, a helium cadmium laser, and an yttrium aluminum garnet (YAG)laser], a light emitting diode, and a cathode ray tube.

As a unit with which the linearly polarized light is obtained, a method using a polarizing plate (for example, an iodine polarizing plate, a dichroic colorant polarizing plate, and a wire grid polarizing plate), a method using a reflective polarizer with a prism-based element (for example, a Glan-Thompson prism) or a Brewster angle, or a method using light emitted from a laser light source having polarized light can be adopted. Alternatively, only light at a required wavelength may be selectively irradiated using a filter, a wavelength conversion element, or the like.

With regard to light to be irradiated, in the case of linearly polarized light, a method of irradiating light from the upper surface or the back surface of the alignment film to the surface of the alignment film orthogonally or obliquely is adopted. The incident angle of light varies depending on the photo-alignment material, but is preferably 0° to 90° (orthogonal), and more preferably 40° to 90°.

In the case of non-polarized light, the alignment film is irradiated with non-polarized light obliquely. The incident angle is preferably 10° to 80°, more preferably 20° to 60°, and particularly preferably 300 to 50°.

The irradiation time is preferably 1 to 60 minutes, and more preferably 1 to 10 minutes.

In a case where patterning is necessary, a method of performing light irradiation using a photomask as many times as necessary for pattern formation or a method of writing a pattern by laser light scanning can be adopted.

[Adhesive Layer]

The laminate of the embodiment of the present invention may have an adhesive layer between the optical film and the λ/4 plate.

In the present specification, the "adhesive layer" is a concept including a "pressure-sensitive adhesive layer". Here, the "pressure-sensitive adhesion" is a type of adhesion and means that an adhesive force (pressure-sensitive adhesive force) changes little even after a certain period of time after being attached to an adherend, and can be peeled off as necessary. In addition, the "adhesion" is a concept including the "pressure-sensitive adhesion", and simply means that objects to be attached to each other are adhered in an integrated state.

The adhesive layer preferably includes a pressure-sensitive adhesive. Examples of the pressure-sensitive adhesive include a rubber-based pressure-sensitive adhesive, a (meth)acrylic pressure-sensitive adhesive, a silicone-based pressure-sensitive adhesive, a urethane-based pressure-sensitive adhesive, a vinylalkyl ether-based pressure-sensitive adhesive, a polyvinyl alcohol-based pressure-sensitive adhesive, a polyvinylpyrrolidone-based pressure-sensitive adhesive, a polyacrylamide-based pressure-sensitive adhesive, and a cellulose-based pressure-sensitive adhesive.

Among those, the acrylic pressure-sensitive adhesive (adhesive which is sensitive to a pressure) is preferable from the viewpoints of transparency, weather fastness, heat resistance, and the like.

The adhesive layer can be formed by, for example, a method of applying a solution of a pressure-sensitive adhesive (adhesive composition) on a release sheet, drying, and then transferring the solution to the surface of a transparent resin layer, a method of directly applying a solution of a pressure-sensitive adhesive on the surface of a transparent resin layer and drying; or the like.

The solution of the pressure-sensitive adhesive (adhesive composition) is prepared as a solution at approximately 10% to 40% by mass in which a pressure-sensitive adhesive is dissolved or dispersed in a solvent such as toluene and ethyl acetate.

As the coating method, a roll coating method such as reverse coating and gravure coating, a spin coating method, a screen coating method, a fountain coating method, a dipping method, and a spray method can be adopted.

The adhesive composition may include the above-mentioned antistatic agent, and may also include other components (for example, a curing agent and a coupling agent).

Furthermore, examples of a material constituting the release sheet include an appropriate thin leaf such as a synthetic resin film such as polyethylene, polypropylene, and polyethylene terephthalate; a rubber sheet; a paper, a fabric; a nonwoven fabric; a net; and a foamed sheet.

In the present invention, a thickness of any adhesive layer is not particularly limited, but is preferably 3 to 50 µm, more preferably 4 to 40 µm, and particularly preferably 5 to 30 µm.

[Protective Layer]

The optical film in the laminate of the embodiment of the present invention may have a protective layer. In a case where the optical film has the protective layer, the protective layer is disposed closer to the λ/4 plate than the light absorption anisotropic film. The protective layer is also called a barrier layer or a gas barrier layer (oxygen barrier layer), and has a function of protecting the light absorption anisotropic film from a gas such as oxygen in the air, moisture, the compounds included in an adjacent layer.

With regard to the protective layer, reference can be made to, for example, the descriptions in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, or paragraphs [0021] to [0031] of JP2005-169994A.

The laminate of the embodiment of the present invention can be obtained by laminating the respective members in a desired order according to a known method, and a method for producing the same is not particularly limited.

EXAMPLES

Hereinafter, the present invention will be described in more details with reference to Examples. The materials, the amounts to materials used, the ratios, the treatment details, the treatment procedure, or the like shown in the following Examples can be modified as appropriate while not departing from the spirit of the present invention. Therefore, the scope of the present invention will not be restrictively interpreted by the following Examples.

[Manufacture of Optical Film]

<Manufacture of PVA Layer>

A composition for forming an alignment film having the following formulation was continuously applied onto a TAC base material (TG40, manufactured by FUJIFILM Corporation) having a thickness of 40 mm as a transparent support using a #18 wire bar. Thereafter, drying with hot air at 100° C. was performed for 2 minutes to form a 1.3-mm thick polyvinyl alcohol (PVA) layer 1 as an alignment film was formed on the TAC base material.

Composition for Forming Alignment Film

| | |
|---|---|
| The following modified polyvinyl alcohol | 7 parts by weight |
| IRGACURE 2959 (manufactured by BASF) | 0.3 parts by weight |
| Water | 80 parts by mass |
| Isopropyl alcohol | 20 parts by mass |

A modified polyvinyl alcohol having the following structure was synthesized from PVA 103 (manufactured by Kuraray Co., Ltd.) by the method described in JP1997-152509A (JP-H09-152509A).

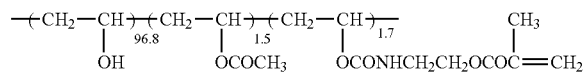

<Formation of Photo-Alignment Film>

A composition 1 for forming a photo-alignment film was prepared with the following formulation, dissolved for 1 hour with stirring, and filtered through a filter having a pore diameter of 0.45 mm.

The following composition 1 for forming a photo-alignment film after filtration was applied onto a PVA layer 1 and dried at 60° C. for 1 minute. Thereafter, the obtained applied coating film was irradiated with linearly polarized ultraviolet rays (an illuminance of 4.5 MW, an irradiation dose of 500 MJ/cm$^2$) using a polarized ultraviolet exposure device to form a photo-alignment film 1.

Composition 1 for Forming a Photo-Alignment Film

| | |
|---|---|
| Photo-alignment material E-1 (below) | 0.3 parts by mass |
| 2-Butoxyethanol | 41.6 parts by mass |
| Dipropylene glycol monomethyl ether acetate | 41.6 parts by mass |
| Pure water | 16.5 parts by mass |

Photo-alignment material E-1

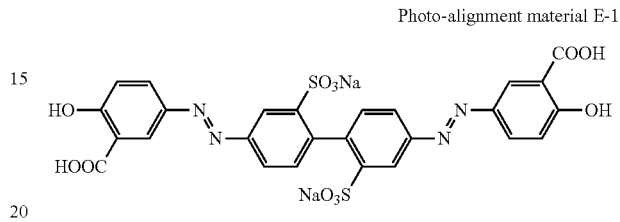

<Preparation of Compositions P1 to P3 for Forming Light Absorption Anisotropic Film>

A composition P1 for forming a light absorption anisotropic film was prepared with the following formulation, dissolved by heating at 50° C. for 1 hour with stirring, and filtered through a filter having a pore diameter of 0.45 mm.

Composition P1 for Forming a Light Absorption Anisotropic Film

| | |
|---|---|
| The following dichroic azo colorant compound D1 | 2.2 parts by mass |
| The following dichroic azo colorant compound D2 | 9.4 parts by mass |
| The following high-molecular liquid crystalline compound M1 | 72.1 parts by mass |
| Polymerization initiator IRGACURE 819 (manufactured by BASF) | 0.7 parts by mass |
| The following interface modifier F-1 | 0.6 parts by mass |
| Cyclopentanone | 274.5 parts by mass |
| Tetrahydrofuran | 640.5 parts by mass |

Dichroic azo colorant compound D1

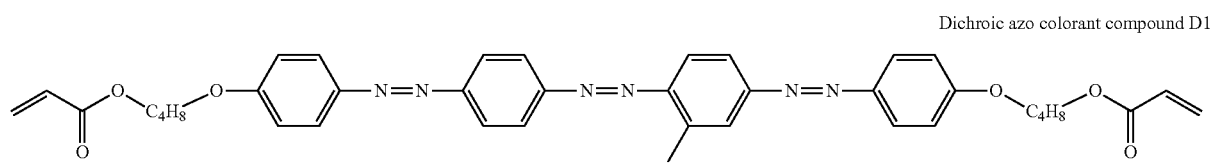

Dichroic azo colorant compound D2

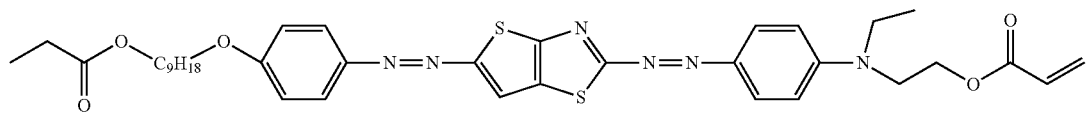

High-molecular liquid crystalline compound M1 (the numerical value in the repeating unit represents % by mole of each repeating unit with respect to all the repeating units in the high-molecular liquid crystalline compound M1)

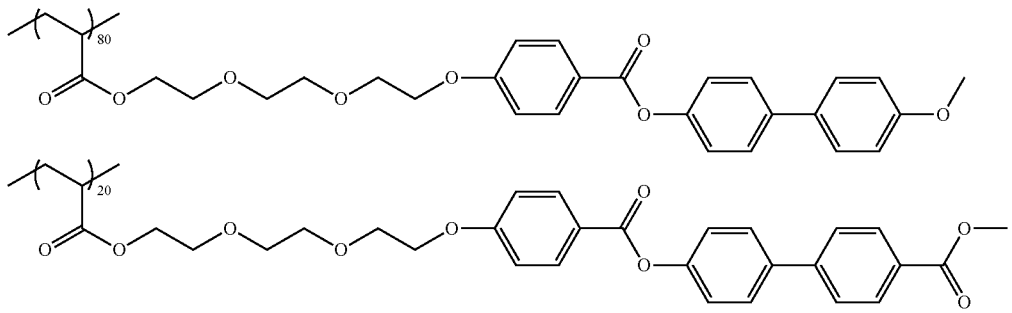

Interface modifier F-1 (the numerical value in the repeating unit represents % by mole of each repeating unit with respect to all the repeating units in the interface modifier F-1)

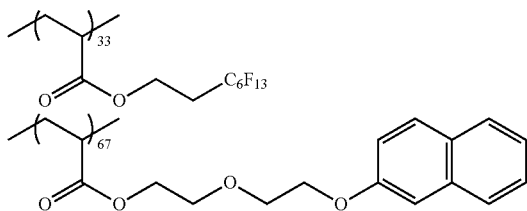

A composition P2 for forming a light absorption anisotropic film was prepared with the following formulation, dissolved by heating at 50° C. for 1 hour with stirring, and filtered through a filter having a pore diameter of 0.45 mm.

Composition P2 for a Forming Light Absorption Anisotropic Film

| | |
|---|---|
| The dichroic azo colorant compound D1 | 9.2 parts by mass |
| The dichroic azo colorant compound D2 | 9.8 parts by mass |
| The high-molecular liquid crystalline compound M1 | 64.7 parts by mass |
| Polymerization initiator IRGACURE 819 (manufactured by BASF) | 0.7 parts by mass |
| The interface modifier F-1 | 0.6 parts by mass |
| Cyclopentanone | 274.5 parts by mass |
| Tetrahydrofuran | 640.5 parts by mass |

A composition P3 for forming a light absorption anisotropic film was prepared with the following formulation, dissolved by heating at 50° C. for 1 hour with stirring, and filtered through a filter having a pore diameter of 0.45 mm.

Composition P3 for a Forming Light Absorption Anisotropic Film

| | |
|---|---|
| The dichroic azo colorant compound D1 | 4.5 parts by mass |
| The dichroic azo colorant compound D2 | 9.3 parts by mass |
| The high-molecular liquid crystalline compound M1 | 69.9 parts by mass |
| Polymerization initiator IRGACURE 819 (manufactured by BASF) | 0.7 parts by mass |

-continued

| | |
|---|---|
| The interface modifier F-1 | 0.6 parts by mass |
| Cyclopentanone | 274.5 parts by mass |
| Tetrahydrofuran | 640.5 parts by mass |

(Formation of Light Absorption Anisotropic Film)

The composition P1 for forming a light absorption anisotropic film was applied onto the obtained photo-alignment film 1 with a wire bar so that the wet application amount was 5.1 cc/m². Subsequently, the film was heated at 140° C. for 90 seconds and cooled again to room temperature (23° C.). Subsequently, the film was heated at 80° C. for 60 seconds and cooled again to room temperature. Thereafter, the film was irradiated with light for 60 seconds under an irradiation condition of an illuminance of 28 MW/cm² using a high-pressure mercury lamp to form a light absorption anisotropic film 1.

Light absorption anisotropic films 2 to 6 were formed by changing the type of the composition for forming a light absorption anisotropic film and the wet coating amount as shown in Table 1 in the same manner as for the light absorption anisotropic film 1.

<Formation of Protective Layer 1>

The following composition 1 for forming a protective layer was continuously applied onto each of the light absorption anisotropic films 1 to 6 with a wire bar at a wet coating amount of 3.4 cc/m² and dried at 60° C. for 1 minute.

Thereafter, the composition 1 for forming a protective layer was irradiated under the irradiation condition of 28 MW/cm² for 60 seconds using a high-pressure mercury lamp and cured to manufacture optical films 1 to 6 having the protective layer 1 formed on the light absorption anisotropic films 1 to 6.

The cross-section of the protective layer 1 was cut out using a microtome cutting machine, and the film thickness was measured by observation with a scanning electron microscope (SEM) and found to be about 0.7 mm.

Composition 1 for Forming a Protective Layer

| | |
|---|---|
| The following hydrophilic monomer HM-1 | 29 parts by mass |
| Polymerization initiator IRGACURE 819 (manufactured by BASF) | 1 part by mass |
| Ethanol | 70 parts by mass |

Hydrophilic monomer HM-1

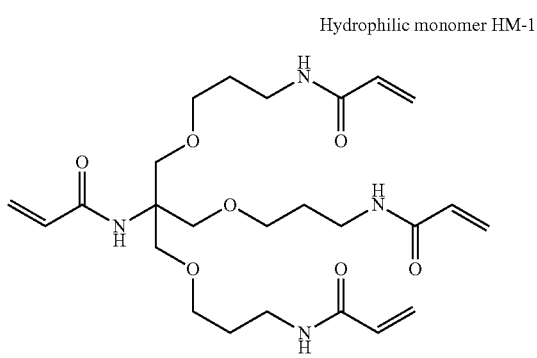 [SMILES: C=CC(=O)NCCCOCC(COCCCNC(=O)C=C)(COCCCNC(=O)C=C)NC(=O)C=C]

<Transmittance and Degree of Polarization of Optical Film>

Each optical film was set on a sample table in a state where a linear polarizer was inserted into the side of a light source of an optical microscope (manufactured by Nikon Corporation, trade name "ECLIPSE E600 POL"), and then irradiated with light from a transparent support side, a transmittance of the optical film in a wavelength range of 400 to 700 nm was measured using a multi-channel spectrometer (manufactured by Ocean Optics Inc., trade name "QE65000"), and a degree of polarization was calculated by the following equation. Table 1 shows the values of P(450), P(550), P(650), and Pmax as the calculation results. Further, Pmax means the maximum value of the degree of polarization at a wavelength of 400 to 700 nm, and is shown in Table 1, together with the wavelength (λ: Pmax) at which Pmax is exhibited.

Degree $P(\%)$ of polarization: $P=100\times4[(Ty0-Tz0)/(Ty0+Tz0)]$

Tz0: Transmittance for polarized light in the absorption axis direction of the optical film Ty0: Transmittance for polarized light in the transmission axis direction of the optical film In addition, the visibility-corrected transmittance (%) of the optical film was calculated, based on the transmittance of the optical film measured as described above, using a 40-mm TAC base material (TG40, manufactured by FUJIFILM Corporation) as a reference to suppress the influence of surface reflection, and performing correction for a visibility with reference to a standard relative visibility as defined by International Illumination Committee (CIE).

[Manufacture of λ/4 Plate]

<Preparation of Composition 2 for Forming Photo-Alignment Film>

(Synthesis of Polymer E-2)

Into a reaction vessel provided with a stirrer, a thermometer, a dripping funnel, and a reflux cooling pipe were introduced 100.0 parts by mass of 2-(3,4-epoxycyclohexyl)ethyltrimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture for 30 minutes with a dripping funnel, and then allowed to undergo a reaction at 80° C. for 6 hours while mixing the mixture under reflux. After completion of the reaction, the organic phase was extracted and washed until water after the washing became neutral with a 0.2%-by-mass aqueous ammonium nitrate solution. Thereafter, the solvent and water were distilled off under reduced pressure from the obtained organic phase to obtain a polyorganosiloxane having an epoxy group as a viscous transparent liquid.

The polyorganosiloxane having an epoxy group was subjected to $^1$H-Nuclear Magnetic Resonance (NMR) analysis, and thus, it was confirmed that peaks based on an oxiranyl group around a chemical shift (A)=3.2 ppm were obtained as per theoretical strength, and a side reaction of the epoxy group did not occur during the reaction. The weight-average molecular weight Mw and the epoxy equivalent of the polyorganosiloxane having an epoxy group were 2,200 and 186 g/mole, respectively.

Next, into a 100-ml three-necked flask were introduced 10.1 parts by mass of the polyorganosiloxane having an epoxy group obtained above, 0.5 parts by mass of an acryloyl group-containing carboxylic acid (manufactured by Toagosei Co., Ltd., trade name "ARONIX M-5300", ω-carboxypolycaprolactone acrylate (a degree of polymerization of n=2)), 20 parts by mass of butyl acetate, 1.5 parts by mass of a cinnamic acid derivative obtained by the method of Synthesis Example 1 of JP2015-026050A, and 0.3 parts by mass of tetrabutylammonium bromide, and the obtained mixture was stirred at 90° C. for 12 hours. After stirring, the mixture was diluted with butyl acetate in the same amount (mass) as that of the obtained mixture, and the diluted mixture was washed with water three times. An operation in which the obtained mixture was concentrated and diluted using butyl acetate was repeated twice to finally obtain a solution including polyorganosiloxane (the following polymer E-2) having a photo-alignment group. The weight-average molecular weight Mw of the polymer E-2 was 9,000. In addition, as a result of $^1$H-NMR analysis, the amount of the components having a cinnamate group in the polymer E-2 was 23.7% by mass.

E-2

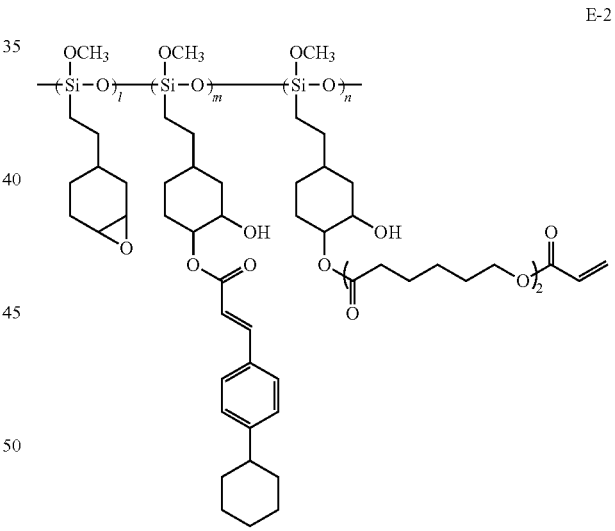

(Preparation of Composition 2 for Forming Photo-Alignment Film)

The following components were mixed to prepare a composition 2 for forming a photo-alignment film.

Composition 2 for Forming a Photo-Alignment Film

| | |
|---|---|
| The polymer E-2 | 10.67 parts by mass |
| The following low-molecular compound R-1 | 5.17 parts by mass |
| The following additive (B-1) | 0.53 parts by mass |
| Butyl acetate | 8,287.37 parts by mass |
| Propylene glycol monomethyl ether acetate | 2,071.85 parts by mass |

Low-molecular compound R-1

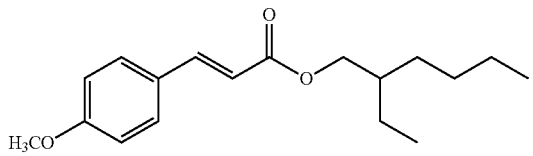

Additive (B-1): TA-60B manufactured by San-Apro Limited (refer to the following structural formula)

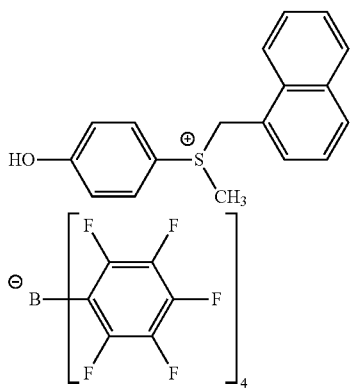

<Preparation of Coating Liquid for Optically Anisotropic Layer>

A coating liquid for an optically anisotropic layer with the following formulation was prepared.

Coating Liquid for an Optically Anisotropic Layer

| | |
|---|---|
| The following liquid crystalline compound L-3 | 42.00 parts by mass |
| The following liquid crystalline compound L-4 | 42.00 parts by mass |
| The following polymerizable compound A-1 | 16.00 parts by mass |
| The following low-molecular compound B2 | 6.00 parts by mass |
| The following polymerization initiator S-1 (oxime-type) | 0.50 parts by mass |
| The following leveling agent G-1 | 0.20 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

In addition, a group adjacent to the acryloyloxy group of each of the following liquid crystalline compounds L-3 and L-4 represents a propylene group (a group in which a methyl group is substituted with an ethylene group), and the following liquid crystalline compounds L-3 and L-4 each represent a mixture of regioisomers having different positions of the methyl groups.

The numerical value in the repeating unit in the leveling agent G-1 represents % by mole of each repeating unit with respect to all the repeating units in the leveling agent G-1.

L-3

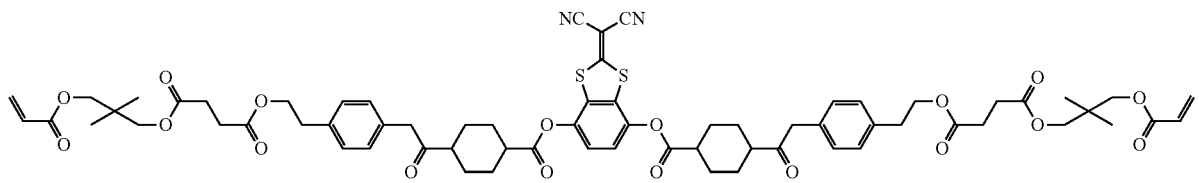

L-4

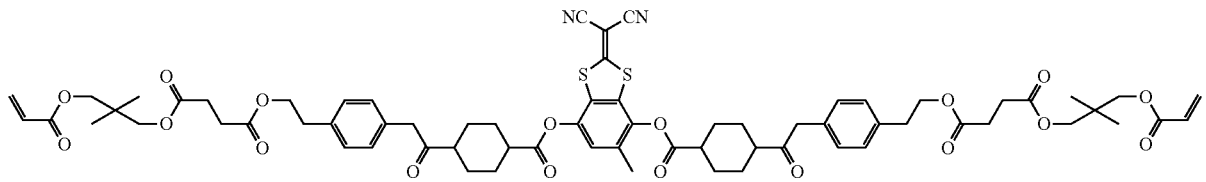

A-1

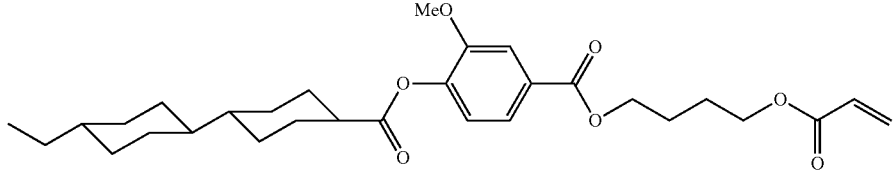

B2

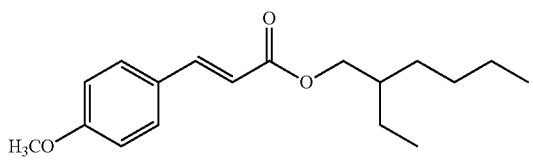

S-1

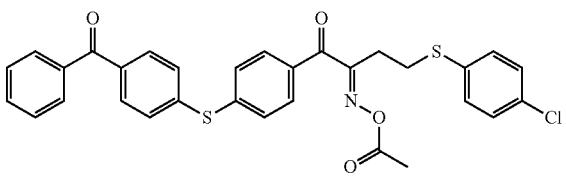

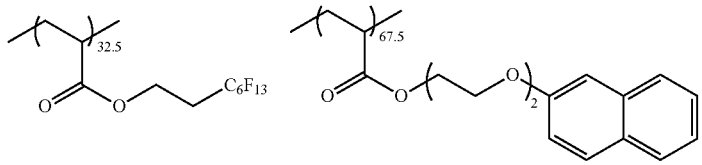

G-1

<Manufacture of Cellulose Acylate Film 1>
(Manufacture of Core Layer Cellulose Acylate Dope)

The following composition was introduced into a mixing tank and stirred to dissolve the respective components, thereby producing a cellulose acetate solution for use as a core layer cellulose acylate dope.

Core Layer Cellulose Acylate Dope

| | |
|---|---|
| Cellulose acetate having a degree of acetyl substitution of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Compound F

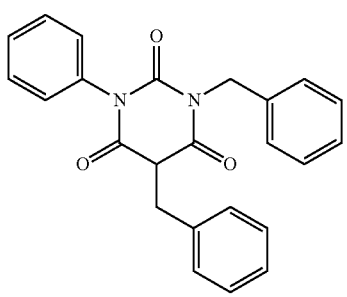

(Manufacture of Outer Layer Cellulose Acylate Dope)

To 90 parts by mass of the core layer cellulose acylate dope was added 10 parts by mass of the following matting agent solution to produce a cellulose acetate solution for use as an outer layer cellulose acylate dope.

Matting Agent Solution

| | |
|---|---|
| Silica particles having an average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| The core layer cellulose acylate dope | 1 part by mass |

(Manufacture of Cellulose Acylate Film 1)

The core layer cellulose acylate dope and the outer layer cellulose acylate dope were filtered through a filter paper having an average pore diameter of 34 mm and a sintered metal filter having an average pore diameter of 10 mm, and then three layers of the core layer cellulose acylate dope and the outer layer cellulose acylate dope on both sides thereof were cast on a drum at 20° C. from the casting ports at the same time (band casting machine).

Subsequently, the film was peeled from the drum at the time that the content of the solvent of the film on the drum reached approximately 20% by mass, the both terminals of the film in the width direction were fixed with tenter clips, and the film was dried while being stretched at a stretching ratio of 1.1 times in the horizontal direction.

Thereafter, the film was transported it between rolls in a heating treatment device and further dried to manufacture an optical film having a thickness of 40 mm, which was taken as a cellulose acylate film 1. The in-plane retardation of the obtained cellulose acylate film 1 was 0 nm.

[Manufacture of λ/4 Plate]

Each composition 2 for forming a photo-alignment film prepared in advance was applied onto a surface on one side of the manufactured cellulose acylate film 1.

After the application, the film was dried in a hot plate at 120° C. for 1 minute to remove the solvent, thereby forming a layer of the composition for forming a photo-alignment film, having a thickness of 0.3 mm.

The obtained layer of the composition for forming a photo-alignment film was irradiated with polarized ultraviolet rays (10 MJ/cm$^2$ using an ultra-high-pressure mercury lamp) to form a photo-alignment film.

Subsequently, the coating liquid for an optically anisotropic layer prepared in advance was applied onto the photo-alignment film with a bar coater to form a composition layer.

The formed composition layer was first heated in a hot plate to 110° C. and then cooled 60° C. to stabilize the alignment.

Thereafter, while keeping the temperature at 60° C., the alignment was fixed by irradiation with ultraviolet rays (500 MJ/cm$^2$, using an ultra-high-pressure mercury lamp) in a nitrogen atmosphere (an oxygen concentration of 100 ppm) to form an optically anisotropic layer having a thickness of 2.3 mm, and thus, a λ/4 plate 1 (λ/4 phase difference film 1) was manufactured. The in-plane retardation of the obtained λ/4 plate 1 at a wavelength of 550 nm was 140 nm.

<Manufacture of Circularly Polarizing Plate>

The optical films 1 to 6 were adhered onto the cellulose acylate film 1 side of the λ/4 plate 1 of via a pressure-sensitive adhesive (adhesive layer), respectively, to obtain circularly polarizing plates 1 to 6.

[Manufacture of Metal Electrode]

A metal electrode 1 was manufactured by vapor-depositing a silver thin film having a thickness of 15 nm on a polyethylene terephthalate (PET) film by a vapor evaporation method. In addition, similarly, a metal electrode 2 was prepared by forming a 20-nm silver thin film on a PET film.

<Reflectance of Metal Electrode>

A reflectance R(%) of each metal electrode was measured by attaching an adapter "ILV-471" to a spectrophotometer "V-550" (manufactured by JASCO Corporation), and R(450), R(550), and R(650) were determined from the obtained reflection spectrum.

The value of A was calculated using 100×{R(450)/P (450)}, 100×{R(550)/P(550)}, and 100×(R(650)/P(650)), calculated based on the reflectance R of the metal electrode and the degree of polarization P of the optical film. The results are shown in Table 1.

[Manufacture of Laminate]

Laminates of Examples and Comparative Examples were obtained by adhering the metal electrode 1 or 2 onto each of the circularly polarizing plates 1 to 6 to a combination in Table 1 such that the λ/4 plate side of the circularly polarizing plate was the metal electrode side.

<Measurement of Reflection Tint>

An adapter "ILV-471" was attached to a spectrophotometer "V-550" (manufactured by JASCO Corporation), light was irradiated from the surface side of the optical film in the laminates of Examples and Comparative Examples, an integrated reflection spectrum of the laminates of Examples and Comparative Examples in the wavelength range of 380 to 780 nm was measured, and reflection tints a* and b* were calculated and evaluated according to the following criteria.

A+: −1<a*<1 and −1<b*<1 are satisfied.

A: −3<a*<3 and −3<b*<3 are satisfied, but the evaluation "A+" is not satisfied.

B: −7<a*<7 and −7<b*<7 are satisfied, but the evaluations "A+" and "A" are not satisfied.

C: None of the evaluations "A+", "A", and "B" is satisfied.

On the other hand, in Comparative Examples 1 and 2, the values of A were 85% or less, and the reflected light appeared colored.

GALAXY S5 (organic EL display device) manufactured by SAMSUNG, equipped with an organic EL panel (organic EL display element), was disintegrated, the touch panel to which the circularly polarizing plate was adhered was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, which was further adhered to the touch panel such that the λ/4 plate side of the circularly polarizing plate manufactured was the panel side, thereby manufacturing an organic EL display device.

Evaluation of the above-mentioned reflection tint was evaluated using the organic EL display device thus obtained, and it was confirmed that the same tendency was shown in the above-mentioned Examples and Comparative Examples.

In addition, GALAXY S5 (organic EL display device) manufactured by SAMSUNG, equipped with an organic EL panel (organic EL display element), was disintegrated, and the touch panel to which the circularly polarizing plate was adhered was peeled from the organic EL display device.

TABLE 1

| | Type of light absorption anisotropic film | Type of composition for forming light absorption anisotropic film | Wet coating amount (cc/m²) of composition for forming light absorption anisotropic film | Visibility-corrected transmittance of optical film | P(450) | P(550) | P(650) |
|---|---|---|---|---|---|---|---|
| Example 1 | 1 | P1 | 5.2 | 57% | 55.0% | 71.0% | 74.0% |
| Example 2 | 2 | P1 | 6.9 | 54% | 63.5% | 79.8% | 82.0% |
| Example 3 | 3 | P1 | 12.0 | 51% | 81.0% | 88.0% | 94.0% |
| Example 4 | 2 | P1 | 6.9 | 54% | 63.5% | 79.8% | 82.0% |
| Example 5 | 6 | P3 | 5.2 | 57% | 61.5% | 70.0% | 74.0% |
| Comparative Example 1 | 4 | P1 | 18.9 | 46% | 90.5% | 99.9% | 99.9% |
| Comparative Example 2 | 5 | P2 | 6.9 | 53% | 87.0% | 81.0% | 75.0% |

| | Pmax | λ: Pmax (nm) | Type of metal electrode | 100 × {R(450)/P(450)} (%) | 100 × {R(550)/P(550)} (%) | 100 × {R(650)/P(650)} (%) | A | Reflection tint |
|---|---|---|---|---|---|---|---|---|
| Example 1 | 75.0% | 610 | 1 | 50.9 | 46.5 | 50.1 | 91% | A |
| Example 2 | 86.8% | 610 | 1 | 44.1 | 41.3 | 45.2 | 91% | A |
| Example 3 | 96.2% | 615 | 1 | 34.6 | 37.5 | 39.5 | 88% | A |
| Example 4 | 86.8% | 610 | 2 | 39.4 | 35.1 | 37.8 | 89% | A |
| Example 5 | 75.0% | 610 | 1 | 45.5 | 47.1 | 50.1 | 91% | A+ |
| Comparative Example 1 | 100.0% | 610 | 1 | 30.9 | 33.0 | 37.1 | 83% | B |
| Comparative Example 2 | 87.0% | 460 | 1 | 32.2 | 40.7 | 49.5 | 65% | C |

As shown in Table 1, in Examples 1 to 5 in which the value of A exceeded 85%, the coloring of the reflected light was suppressed and the reflected light had a substantially neutral tint.

Furthermore, in comparison between Example 1 and Example 5, the values of A were the same in both Examples, and thus, it was considered that the coloring of the reflected light was suppressed to the same extent. However, in Example 5, R(550)/P(550) corresponds to neither min{R(450)/P(450), R(550)/P(550), R(650)/P(650) nor max(R(450)/P(450), R(550)/P(550), and R(650)/P(650)), and it was thus found that an effect of suppressing the coloring of the reflected light was particularly excellent.

Subsequently, the manufactured circularly polarizing plate was adhered to an organic EL panel to manufacture an organic EL display device having no touch panel.

Evaluation of the above-mentioned reflection tint was evaluated using the organic EL display device thus obtained, and it was confirmed that the same tendency was shown in the above-mentioned Examples and Comparative Examples.

EXPLANATION OF REFERENCES

10: laminate
12: optical film
12a: transparent support

12b: light absorption anisotropic film

14: λ/4 plate

16: display element

What is claimed is:

1. A laminate comprising:
an optical film having a light absorption anisotropic film formed from a composition including a dichroic substance, and having a transmittance of more than 50% in a wavelength range of 400 to 700 nm;
a λ/4 plate; and
a metal electrode in this order,
wherein a degree (%) of polarization at a wavelength of λ of the optical film is defined as P(λ) and a reflectance (%) at the wavelength of λ of the metal electrode is defined as R(λ), Formula (A) is satisfied by the laminate, 100×[min{R(450)/P(450),R(550)/P(550),R(650)/P(650)}/max{R(450)/P(450),R(550)/P(550),R(650)/P(650)}]>85%  Formula (A), provided that in Formula (A), min{R(450)/P(450), R(550)/P(550), R(650)/P(650)} and max{R(450)/P(450), R(550)P(550), R(650)/P(650)} mean a minimum value and a maximum value of R(450)/P(450), R(550)/P(550), and R(650)/P(650)}, respectively.

2. The laminate according to claim 1,
wherein in Formula (A), R(550)/P(550) corresponds to neither min(R(450)/P(450), R(550)/P(550), R(650)/P(650)) nor max{R(450)/P(450), R(550)/P(550), R(650)/P(650)}.

3. The laminate according to claim 1,
wherein in Formula (A),
R(450)/P(450) corresponds to min{R(450)/P(450), R(550)/P(550), R(650)/P(650)}, and
R(650)/P(650) corresponds to max{R(450)/P(450), R(550)/P(550), R(650)/P(650)}.

4. The laminate according to claim 1,
wherein the optical film has a maximum value of the degrees of polarization at 555 to 700 nm and satisfies P(450)<P(550).

5. The laminate according to claim 1,
wherein the dichroic substance includes a compound represented by Formula (1),

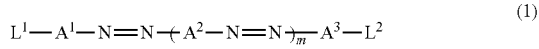
(1)

in Formula (1), $A^1$, $A^1$, and $A^3$ each independently represent a divalent aromatic group which may have a substituent, in Formula (1), $L^1$ and $L^2$ each independently represent a substituent, and in Formula (1), m represents an integer of 1 to 4, and in a case where m is an integer of 2 to 4, a plurality of $A^2$'s may be the same as or different from each other.

6. The laminate according to claim 1,
wherein the dichroic substance includes a compound represented by Formula (2),

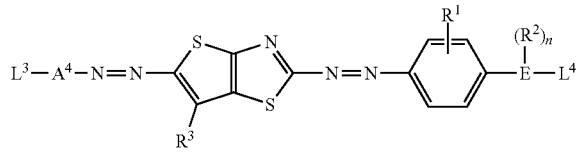
(2)

in Formula (2), $A^1$ represents a divalent aromatic group which may have a substituent, in Formula (2), $L^3$ and $L^4$ each independently represent a substituent, in Formula (2), E represents any one of a nitrogen atom, an oxygen atom, or a sulfur atom, in Formula (2), $R^1$ represents a hydrogen atom, a halogen atom, an alkyl group which may have a substituent, or an alkoxy group which may have a substituent, in Formula (2), $R^2$ represents a hydrogen atom or an alkyl group which may have a substituent, in Formula (2), $R^3$ represents a hydrogen atom or a substituent, and in Formula (2), n represents 0 or 1, provided that in a case where E is the nitrogen atom, n is 1, and in a case where E is an oxygen atom or a sulfur atom, n is 0.

7. The laminate according to claim 1,
wherein a content of the dichroic substance is 25% by mass or less with respect to a total mass of all solid contents of the composition.

8. The laminate according to claim 1,
wherein the λ/4 plate exhibits reciprocal wavelength dispersibility.

9. The laminate according to claim 1,
wherein the metal electrode is an electrode that sandwiches an organic light emitting layer of an organic electroluminescent display panel.

10. The laminate according to claim 1,
wherein the metal electrode is an electrode included in a touch sensor.

11. The laminate according to claim 2,
wherein in Formula (A),
R(450)/P(450) corresponds to min{R(450)/P(450), R(550)/P(550), R(650)/P(650)}, and
R(650)/P(650) corresponds to max(R(450)/P(450), R(550)/P(550), R(650)/P(650)).

12. The laminate according to claim 2,
wherein the optical film has a maximum value of the degrees of polarization at 555 to 700 nm and satisfies P(450)<P(550).

13. The laminate according to claim 2,
wherein the dichroic substance includes a compound represented by Formula (1),

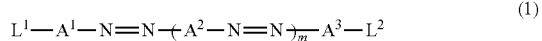
(1)

in Formula (1), $A^1$, $A^2$, and $A^3$ each independently represent a divalent aromatic group which may have a substituent, in Formula (1), $L^1$ and $L^2$ each independently represent a substituent, and in Formula (1), m represents an integer of 1 to 4, and in a case where m is an integer of 2 to 4, a plurality of $A^2$'s may be the same as or different from each other.

14. The laminate according to claim 2,
wherein the dichroic substance includes a compound represented by Formula (2),

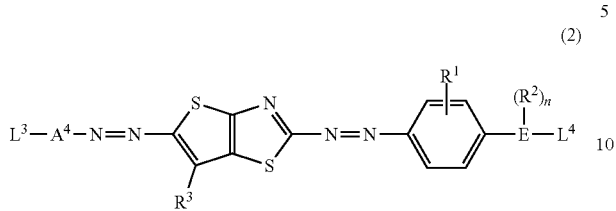

(2)

in Formula (2), $A^4$ represents a divalent aromatic group which may have a substituent, in Formula (2), $L^3$ and $L^4$ each independently represent a substituent, in Formula (2), E represents any one of a nitrogen atom, an oxygen atom, or a sulfur atom, in Formula (2), $R^1$ represents a hydrogen atom, a halogen atom, an alkyl group which may have a substituent, or an alkoxy group which may have a substituent, in Formula (2), $R^2$ represents a hydrogen atom or an alkyl group which may have a substituent, in Formula (2), $R^3$ represents a hydrogen atom or a substituent, and in Formula (2), n represents 0 or 1, provided that in a case where E is the nitrogen atom, n is 1, and in a case where E is an oxygen atom or a sulfur atom, n is 0.

15. The laminate according to claim 2,
wherein a content of the dichroic substance is 25% by mass or less with respect to a total mass of all solid contents of the composition.

16. The laminate according to claim 2,
wherein the λ/4 plate exhibits reciprocal wavelength dispersibility.

17. The laminate according to claim 2,
wherein the metal electrode is an electrode that sandwiches an organic light emitting layer of an organic electroluminescent display panel.

18. The laminate according to claim 2,
wherein the metal electrode is an electrode included in a touch sensor.

19. The laminate according to claim 3,
wherein the optical film has a maximum value of the degrees of polarization at 555 to 700 nm and satisfies P(450)<P(550).

20. The laminate according to claim 3,
wherein the dichroic substance includes a compound represented by Formula (1),

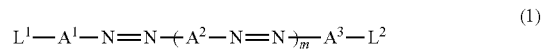

(1)

in Formula (1), $A^1$, $A^2$, and $A^3$ each independently represent a divalent aromatic group which may have a substituent, in Formula (1), $L^1$ and $L^2$ each independently represent a substituent, and in Formula (1), m represents an integer of 1 to 4, and in a case where m is an integer of 2 to 4, a plurality of $A^2$'s may be the same as or different from each other.

* * * * *